US012516415B2

(12) United States Patent
Enzu

(10) Patent No.: US 12,516,415 B2
(45) Date of Patent: Jan. 6, 2026

(54) REACTIVE MATERIAL AND METHOD OF PRODUCING THIN-FILM

(71) Applicant: ADEKA CORPORATION, Tokyo (JP)

(72) Inventor: Masaki Enzu, Tokyo (JP)

(73) Assignee: ADEKA CORPORATION, Tokyo (JP)

( * ) Notice: Subject to any disclaimer, the term of this patent is extended or adjusted under 35 U.S.C. 154(b) by 0 days.

(21) Appl. No.: 18/292,077

(22) PCT Filed: Jul. 19, 2022

(86) PCT No.: PCT/JP2022/028006
§ 371 (c)(1),
(2) Date: Jan. 25, 2024

(87) PCT Pub. No.: WO2023/008248
PCT Pub. Date: Feb. 2, 2023

(65) Prior Publication Data

US 2024/0360558 A1 Oct. 31, 2024

(30) Foreign Application Priority Data

Jul. 29, 2021 (JP) ................................ 2021-124205

(51) Int. Cl.
*C23C 16/455* (2006.01)
*C23C 16/02* (2006.01)
(Continued)

(52) U.S. Cl.
CPC .... *C23C 16/45553* (2013.01); *C23C 16/0272* (2013.01); *C23C 16/18* (2013.01); *C23C 16/4408* (2013.01)

(58) Field of Classification Search
CPC .......... C23C 16/45553; C23C 16/0272; C23C 16/18; C23C 16/4408; C23C 16/4481;
(Continued)

(56) References Cited

U.S. PATENT DOCUMENTS 6,476,247 B1 11/2002 Okamoto et al.
2002/0173054 A1 11/2002 Kim
(Continued)

FOREIGN PATENT DOCUMENTS

JP 2001-163894 A 6/2001
JP 2003-49267 A 2/2003
(Continued)

OTHER PUBLICATIONS

International Search Report dated Sep. 13, 2022 in International Bureau of WIPO Patent Application No. PCT/JP2022/028006, with an English translation thereof.
(Continued)

*Primary Examiner* — Michael G Miller
(74) *Attorney, Agent, or Firm* — GREENBLUM & BERNSTEIN, P.L.C.

(57) ABSTRACT

Provided is a reactive material, including a compound represented by the following general formula (1) or (2).

(1)

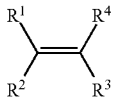

In the formula (1), $R^1$, $R^2$, $R^3$, and $R^4$ each independently represent a hydrogen atom, a hydrocarbon group having 1 to 4 carbon atoms, or an electron-withdrawing group, provided that at least one of $R^1$, $R^2$, $R^3$, or $R^4$ represents the electron-withdrawing group.

(2)

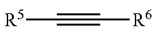

In the formula (2), $R^5$ and $R^6$ each independently represent a hydrogen atom, a hydrocarbon group having 1 to 4 carbon
(Continued)

atoms, or an electron-withdrawing group, provided that at least one of $R^5$ or $R^6$ represents the electron-withdrawing group.

11 Claims, 4 Drawing Sheets

(51) Int. Cl.
*C23C 16/18* (2006.01)
*C23C 16/44* (2006.01)

(58) Field of Classification Search
CPC .............. C23C 16/4412; C23C 16/455; C07C 21/14; C07C 255/06; C07F 15/00; Y02E 60/50
See application file for complete search history.

(56) References Cited

U.S. PATENT DOCUMENTS

| | | | | |
|---|---|---|---|---|
| 2016/0272664 | A1 | 9/2016 | Hatase et al. | |
| 2018/0258526 | A1 | 9/2018 | Harada et al. | |
| 2018/0291051 | A1* | 10/2018 | Anthis | C07F 15/02 |
| 2020/0392623 | A1 | 12/2020 | Knisley | |
| 2022/0002867 | A1 | 1/2022 | Nishida et al. | |
| 2022/0018018 | A1 | 1/2022 | Harada et al. | |

FOREIGN PATENT DOCUMENTS

| | | | |
|---|---|---|---|
| JP | 2003-342734 | A | 12/2003 |
| JP | 2014-118605 | A | 6/2014 |
| JP | 6509128 | B2 | 5/2019 |
| WO | 2015/093177 | A1 | 6/2015 |
| WO | 2017/043620 | A1 | 3/2017 |
| WO | 2020/095744 | A1 | 5/2020 |
| WO | 2020/116364 | A1 | 6/2020 |

OTHER PUBLICATIONS

Written Opinion dated Sep. 13, 2022 in International Bureau of WIPO Patent Application No. PCT/JP2022/028006, with an English translation thereof.

Office Action that issued in corresponding Taiwanese Patent Application No. 111127714, dated Aug. 25, 2025, which includes an Appendix/Search Report in which an "A" indication has been identified for US 2020/0392623 A1.

* cited by examiner

REACTIVE MATERIAL AND METHOD OF PRODUCING THIN-FILM

TECHNICAL FIELD

The present invention relates to a reactive material to be used for reducing an organometallic compound to a metal and a method of producing a thin-film using the same.

BACKGROUND ART

A metallic ruthenium thin-film, which shows specific electrical characteristics, has been utilized for various applications. For example, its utilization for an electrode material of a memory device typified by a DRAM device, a resistance film, a diamagnetic film used for a recording layer of a hard disk, a catalyst material for a polymer electrolyte fuel cell, a wiring material of a semiconductor device, and a metal gate material of, for example, a MOS-FET has been known.

As a method of producing the thin-film, there are given, for example, a sputtering method, an ion plating method, a MOD method, such as a coating thermal decomposition method or a sol-gel method, and chemical vapor deposition methods. Of those, chemical vapor deposition methods including a CVD method and an atomic layer deposition method (hereinafter sometimes referred to as "ALD method") are mainly used because the methods have many advantages, such as excellent composition controllability and step coverage, suitability for mass production, and capability of hybrid integration.

Various organoruthenium compounds have been known as organoruthenium compounds to be used for the chemical vapor deposition methods, such as the CVD method and the ALD method. For example, in Patent Document 1, there is a disclosure of a method of producing a ruthenium-containing thin-film through use of a ruthenium complex mixture containing two or more kinds of ruthenium complexes and a reducing gas. In Patent Document 2, there is a disclosure of a method of producing a ruthenium-containing thin-film through use of a thin-film forming raw material containing a ruthenium compound formed of two six-membered rings each having two carbonyl groups, a ruthenium atom, and a ketoimine group in a ring structure thereof. In Patent Document 3, there is a disclosure of a method of producing a metallic ruthenium thin-film, including: a step of allowing a ruthenium compound having cyclohexadiene and a benzene ring in a structure thereof to deposit on a substrate; and a step of allowing a reactive gas containing a specific compound to react with the ruthenium compound deposited on the substrate.

CITATION LIST

Patent Document

Patent Document 1: JP 2014-118605 A
Patent Document 2: JP 6509128 B2
Patent Document 3: WO 2020/095744 A1

SUMMARY OF INVENTION

Technical Problem

However, the related-art methods of producing a metallic ruthenium thin-film by an ALD method have each had a problem in that a composite thin-film including metallic ruthenium and ruthenium oxide is formed, or a metallic ruthenium thin-film containing a large amount of residual carbon is formed. The composite thin-film including ruthenium oxide has been required to be reduced to metallic ruthenium through treatment under high temperature, and hence a substrate and peripheral members have been damaged in some cases.

Accordingly, an object of the present invention is to provide a method capable of producing a high-quality metallic ruthenium thin-film containing a small amount of ruthenium oxide and a small amount of residual carbon, and a reactive material to be used therefor.

Solution to Problem

The inventor of the present invention has repeated extensive investigations, and as a result, has found that the above-mentioned problems can be solved by using a reactive material containing a specific compound to reach the present invention.

That is, the present invention is represented by the following items [1] to [8].

[1] A reactive material, including a compound represented by the following general formula (1) or (2):

(1)

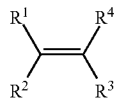

in the formula (1), $R^1$, $R^2$, $R^3$, and $R^4$ each independently represent a hydrogen atom, a hydrocarbon group having 1 to 4 carbon atoms, or an electron-withdrawing group, and the electron-withdrawing group is selected from the group consisting of: a fluorine atom; a chlorine atom; a bromine atom; an iodine atom; a trifluoromethyl group; a trichloromethyl group; a tribromomethyl group; a triiodomethyl group; a cyano group; an aldehyde group; an acetyl group; a carboxy group; a carboxymethyl group; a sulfo group; and a sulfomethyl group, provided that at least one of $R^1$, $R^2$, $R^3$, or $R^4$ represents the electron-withdrawing group; and (2)

in the formula (2), $R^5$ and $R^6$ each independently represent a hydrogen atom, a hydrocarbon group having 1 to 4 carbon atoms, or an electron-withdrawing group, and the electron-withdrawing group is selected from the group consisting of: a fluorine atom; a chlorine atom; a bromine atom; an iodine atom; a trifluoromethyl group; a trichloromethyl group; a tribromomethyl group; a triiodomethyl group; a cyano group; an aldehyde group; an acetyl group; a carboxy group; a carboxymethyl group; a sulfo group; and a sulfomethyl group, provided that at least one of $R^5$ or $R^6$ represents the electron-withdrawing group.

[2] The reactive material according to Item [1], wherein the reactive material is used for reducing an organometallic compound to a metal.

[3] A method of producing a thin-film, including forming a metallic ruthenium thin-film through use of the reactive material of Item [1] or [2] by an atomic layer deposition method.

[4] The method of producing a thin-film according to Item [3], wherein the method includes the steps of: forming a precursor thin-film through use of a thin-film forming raw material containing an organoruthenium compound; and forming a metallic ruthenium thin-film by causing the precursor thin-film to react with the reactive material.

[5] The method of producing a thin-film according to Item [4], wherein the organoruthenium compound is selected from the group consisting of: an organoruthenium compound represented by the following general formula (3); an organoruthenium compound represented by the following general formula (4); and an organoruthenium compound represented by the following general formula (5):

$$Ru(L^1)_3 \quad (3)$$

$$Ru(L^1)_n(X)_{2-n}(L^2)_m \quad (4)$$

$$Ru(L^3)_y(L^4)_z(L^2)_m \quad (5)$$

in the formulae (3), (4), and (5), $L^1$ represents a covalent bonding ligand selected from the group consisting of: an aminoalkoxy group; an amidinate group; a β-diketonate group; a β-ketoiminate group; a β-diketiminate group; a group having a structure of a 2,4-pentadienyl group; and a group having a structure of a cyclopentadienyl group, X represents a halogen atom, "n" represents an integer of from 0 to 2, $L^2$ represents an electron-donating ligand selected from the group consisting of: a carbonyl group; a cyano group; a trialkylphosphine compound; and an isocyanide compound, "m" represents an integer of from 0 to 3, $L^3$ represents an electron-donating ligand selected from the group consisting of: a chain diene compound; a cyclic diene compound; a chain polyene compound; and a cyclic polyene compound, "y" represents 1 or 2, $L^4$ represents an electron-donating ligand formed of an arene compound, and "z" represents 0 or 1.

[6] The method of producing a thin-film according to Item [4] or [5], wherein the step of forming a precursor thin-film includes depositing the vaporized thin-film forming raw material on a surface of a substrate heated to a temperature of from 100° C. to 450° C.

[7] The method of producing a thin-film according to Item [6], wherein the method further includes, after the step of forming a precursor thin-film, a step of evacuating the undeposited thin-film forming raw material from a reaction system.

[8] The method of producing a thin-film according to Item [7], wherein the method further includes, after the step of forming a metallic ruthenium thin-film, a step of evacuating the unreacted reactive material from the reaction system, and wherein the method includes repeatedly performing the step of forming a precursor thin-film, the step of evacuating the undeposited thin-film forming raw material from the reaction system, the step of forming a metallic ruthenium thin-film, and the step of evacuating the unreacted reactive material from the reaction system.

Advantageous Effects of Invention

According to the present invention, the method capable of producing a high-quality metallic ruthenium thin-film containing a small amount of ruthenium oxide and a small amount of residual carbon, and the reactive material to be used therefor can be provided.

DESCRIPTION OF EMBODIMENTS

Figure 1:
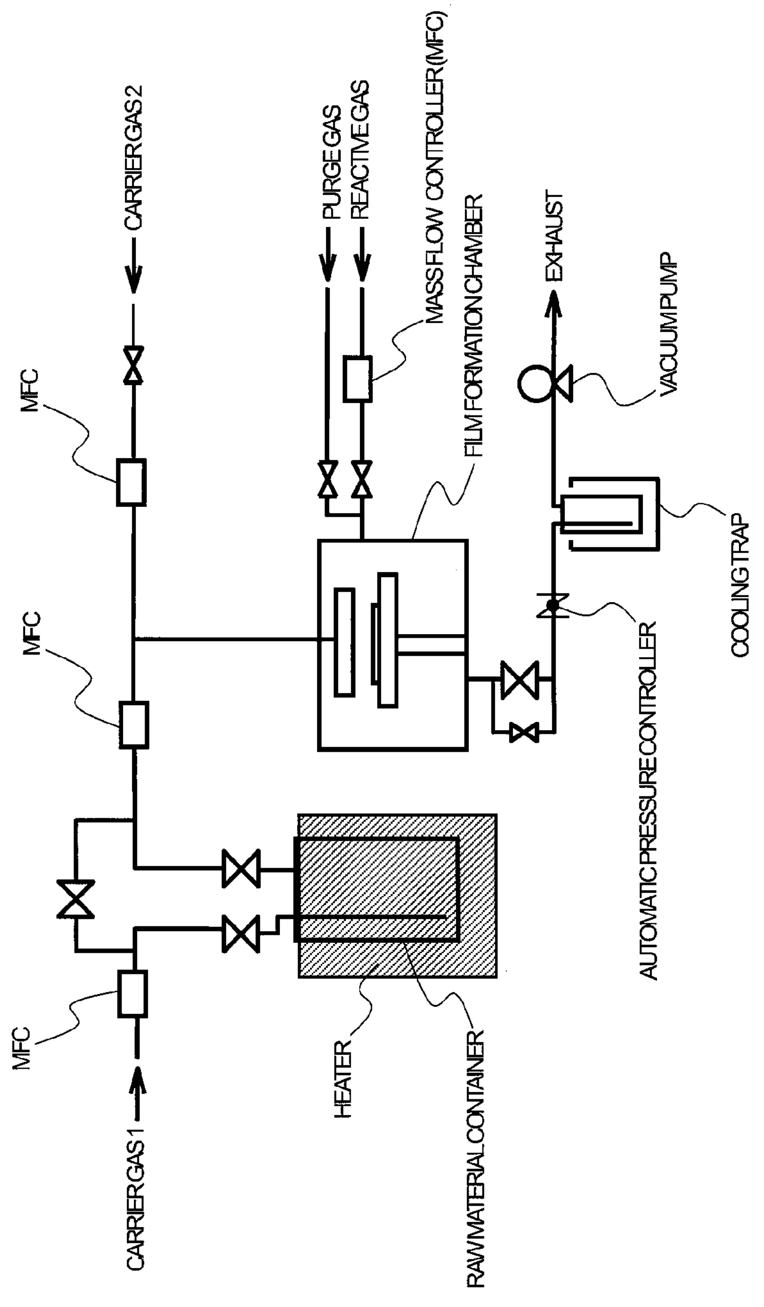
FIG. 1 is a schematic diagram for illustrating an example of an ALD apparatus to be used in a method of producing a thin-film of the present invention.

The present invention is directed to a reactive material containing a compound represented by the general formula (1) or (2). Herein, the reactive material refers to a material capable of reducing an organometallic compound to a metal, and more specifically refers to a material capable of reacting with a precursor thin-film formed of a precursor including an organometallic compound to form a metal film. A metal of the metal film is a metal derived from a metal species of the precursor. The reactive material of the present invention is not limited by the metal species of the precursor, but is preferably caused to react with a precursor thin-film formed of a precursor including an organoruthenium compound from the viewpoint that satisfactory reactivity is obtained.

Examples of the hydrocarbon group having 1 to 4 carbon atoms represented by each of $R^1$, $R^2$, $R^3$, and $R^4$ in the general formula (1) include a saturated hydrocarbon group and an unsaturated hydrocarbon group. Examples of the saturated hydrocarbon group include alkyl groups, such as a methyl group, an ethyl group, a propyl group, an isopropyl group, a n-butyl group, an isobutyl group, a sec-butyl group, and a tert-butyl group. Examples of the unsaturated hydrocarbon group include: alkyl groups each containing an alkenyl group, such as an allylmethyl group and a propenylmethyl group; and alkyl groups each containing an alkynyl group such as an ethynylmethyl group.

Preferably two or more, more preferably three or more of $R^1$, $R^2$, $R^3$, and $R^4$ in the general formula (1) represent electron-withdrawing groups from the viewpoint that such reactive material easily reacts with an organoruthenium compound at low temperature to form a metallic ruthenium thin-film containing a small amount of ruthenium oxide.

The electron-withdrawing group represented by each of $R^1$, $R^2$, $R^3$, and $R^4$ in the general formula (1) is selected from the group consisting of: a fluorine atom; a chlorine atom; a bromine atom; an iodine atom; a trifluoromethyl group; a trichloromethyl group; a tribromomethyl group; a triiodomethyl group; a cyano group; an aldehyde group; an acetyl group; a carboxy group; a carboxymethyl group; a sulfo group; and a sulfomethyl group.

When two or more of $R^1$, $R^2$, $R^3$, and $R^4$ represent the electron-withdrawing groups, the electron-withdrawing groups in one molecule may be of different kinds, but are preferably of the same kind. When three of $R^1$, $R^2$, $R^3$, and $R^4$ represent the electron-withdrawing groups, the electron-withdrawing groups are each preferably a halogen atom, such as a fluorine atom, a chlorine atom, a bromine atom, or an iodine atom. When all of $R^1$, $R^2$, $R^3$, and $R^4$ represent the electron-withdrawing groups, the electron-withdrawing groups are each preferably a cyano group from the viewpoint that a metallic ruthenium thin-film containing a small amount of ruthenium oxide is easily formed.

When at least one of $R^1$, $R^2$, $R^3$, or $R^4$ does not represent the electron-withdrawing group, the at least one of $R^1$, $R^2$, $R^3$, or $R^4$ preferably represents a hydrogen atom or a methyl group from the viewpoint that a metallic ruthenium thin-film containing a small amount of ruthenium oxide is easily formed.

From the viewpoint that a metallic ruthenium thin-film containing a small amount of ruthenium oxide is easily formed, the reactive material of the present invention preferably contains a compound in which at least one of $R^1$, $R^2$, $R^3$, or $R^4$ in the general formula (1) represents a fluorine atom, a chlorine atom, a bromine atom, an iodine atom, a cyano group, or a trifluoromethyl group, and more preferably contains a compound in which at least one of $R^1$, $R^2$, $R^3$, or $R^4$ in the general formula (1) represents a fluorine atom, a chlorine atom, a bromine atom, an iodine atom, or a cyano group.

Preferred specific examples of the compound represented by the general formula (1) include Compounds No. 1 to No. 225 below. However, the present invention is not limited to those compounds. In the following formulae, "Me" represents a methyl group, "$CF_3$" represents a trifluoromethyl group, "$CCl_3$" represents a trichloromethyl group, "$CBr_3$" represents a tribromomethyl group, "$CI_3$" represents a triiodomethyl group, "CN" represents a cyano group, "CHO" represents an aldehyde group, "$COCH_3$" represents an acetyl group, "COOH" represents a carboxy group, "$COOCH_3$" represents a carboxymethyl group, "$SO_3H$" represents a sulfo group, and "$SO_2CH_3$" represents a sulfomethyl group.

No.1

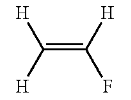

No.2

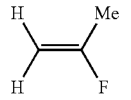

No.3

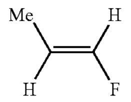

No.4

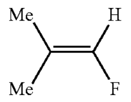

No.5

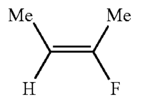

No.6

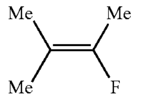

No.7

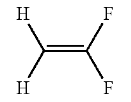

-continued

No.8

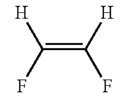

No.9

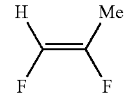

No.10

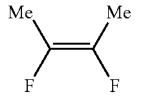

No.11

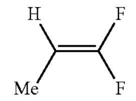

No.12

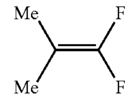

No.13

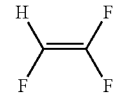

No.14

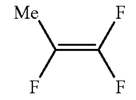

No.15

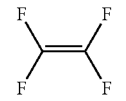

No.16

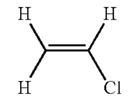

No.17

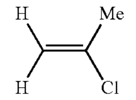

No.18

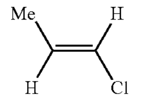

No.19

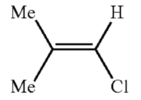

No.20

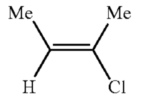

No.21

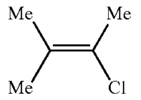

-continued
No.22
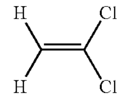
No.23
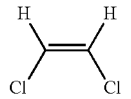
No.24
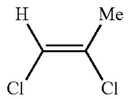
No.25
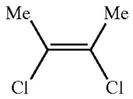
No.26
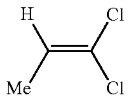
No.27
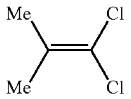
No.28
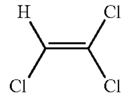
No.29
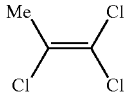
No.30
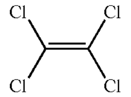
No.31
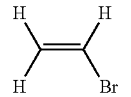
No.32
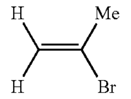
No.33
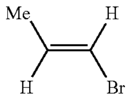
No.34
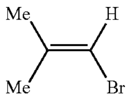
No.35
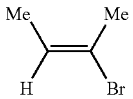
-continued
No.36
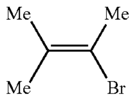
No.37
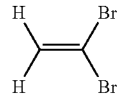
No.38
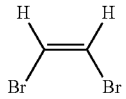
No.39
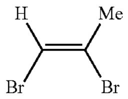
No.40
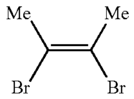
No.41
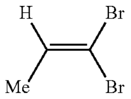
No.42
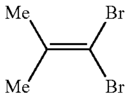
No.43
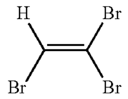
No.44
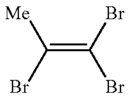
No.45
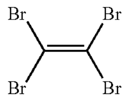
No.46
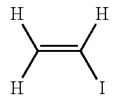
No.47
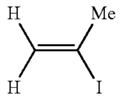
No.48
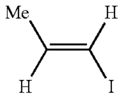
No.49
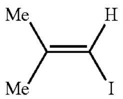

-continued
No.50
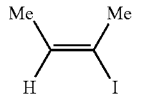
No.51
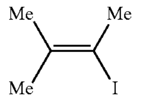
No.52
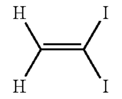
No.53
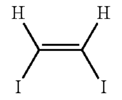
No.54
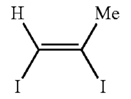
No.55
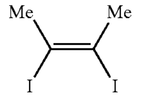
No.56
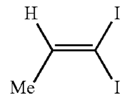
No.57
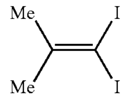
No.58
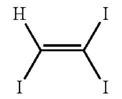
No.59
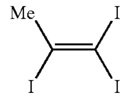
No.60
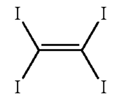
No.61
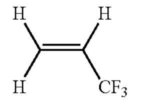
No.62
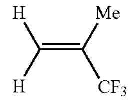
No.63
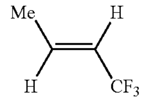
-continued
No.64
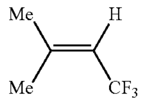
No.65
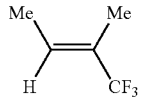
No.66
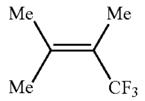
No.67
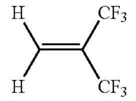
No.68
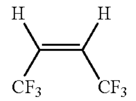
No.69
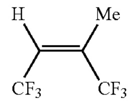
No.70
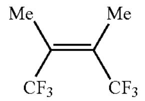
No.71
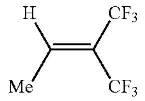
No.72
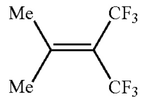
No.73
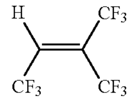
No.74
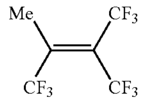
No.75
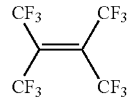
No.76
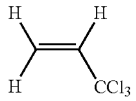
No.77
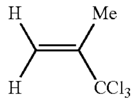

-continued
No.78
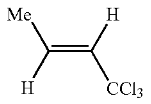
No.79
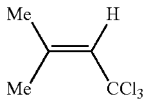
No.80
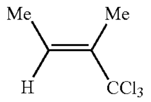
No.81
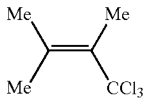
No.82
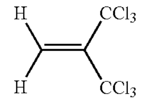
No.83
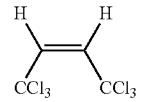
No.84
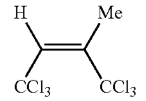
No.85
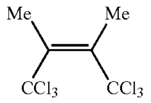
No.86
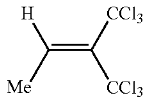
No.87
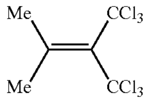
No.88
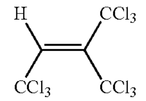
No.89
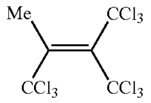
No.90
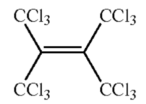
No.91
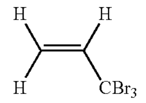
-continued
No.92
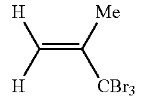
No.93
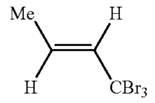
No.94
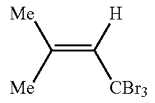
No.95
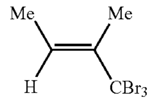
No.96
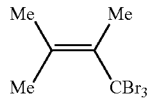
No.97
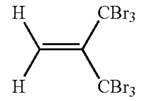
No.98
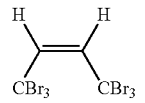
No.99
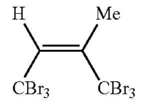
No.100
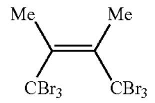
No.101
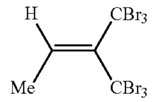
No.102
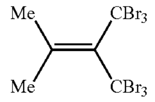
No.103
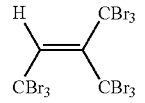
No.104
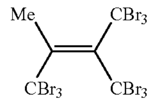
No.105
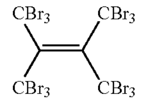

-continued
No.106
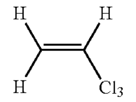
No.107
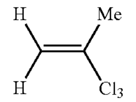
No.108
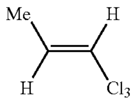
No.109
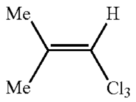
No.110
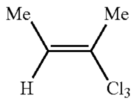
No.111
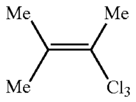
No.112
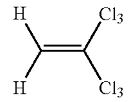
No.113
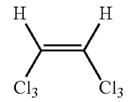
No.114
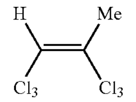
No.115
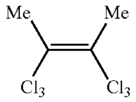
No.116
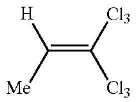
No.117
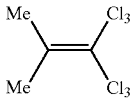
No.118
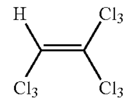
No.119
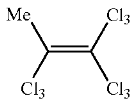
-continued
No.120
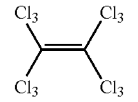
No.121
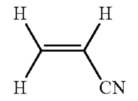
No.122
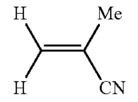
No.123
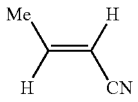
No.124
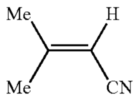
No.125
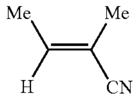
No.126
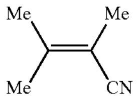
No.127
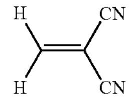
No.128
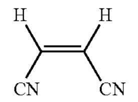
No.129
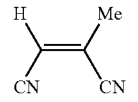
No.130
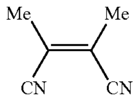
No.131
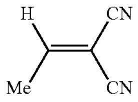
No.132
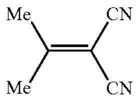
No.133
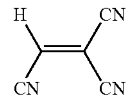

-continued
No.134
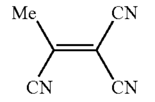
No.135
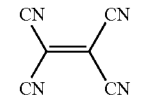
No.136
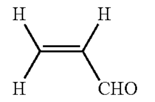
No.137
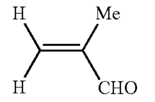
No.138
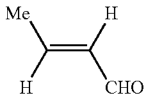
No.139
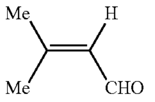
No.140
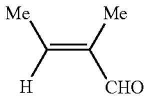
No.141
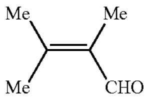
No.142
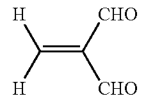
No.143
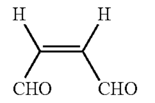
No.144
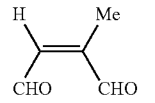
No.145
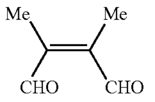
No.146
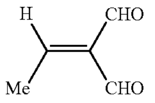
No.147
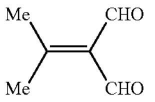
-continued
No.148
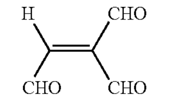
No.149
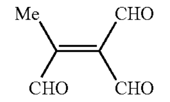
No.150
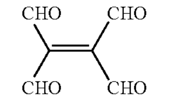
No.151
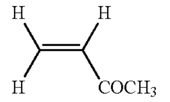
No.152
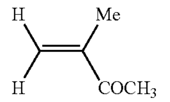
No.153
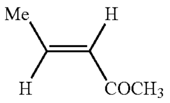
No.154
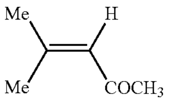
No.155
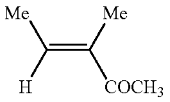
No.156
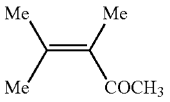
No.157
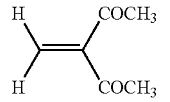
No.158
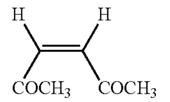
No.159
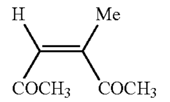
No.160
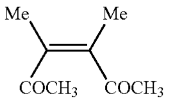
No.161
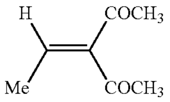

-continued
No.162
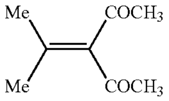
No.163
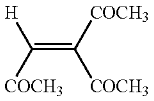
No.164
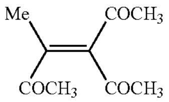
No.165
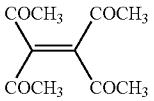
No.166
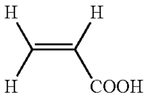
No.167
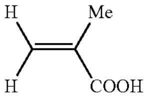
No.168
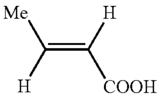
No.169
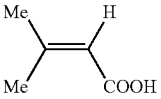
No.170
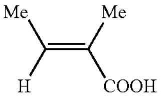
No.171
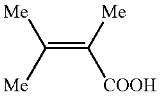
No.172
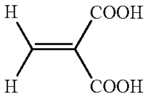
No.173
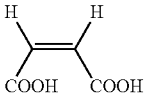
No.174
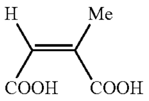
No.175
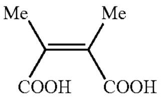
-continued
No.176
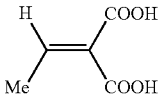
No.177
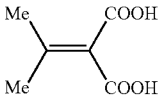
No.178
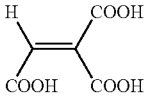
No.179
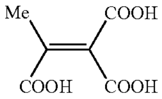
No.180
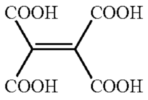
No.181
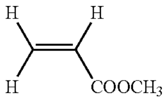
No.182
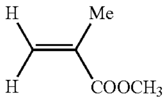
No.183
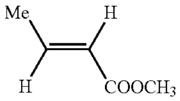
No.184
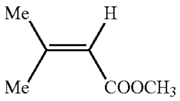
No.185
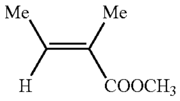
No.186
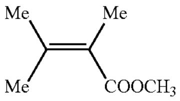
No.187
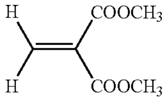
No.188
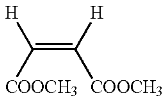
No.189
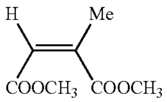

-continued
No.190
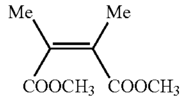
No.191
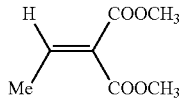
No.192
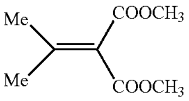
No.193
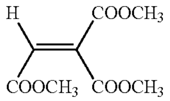
No.194
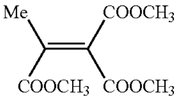
No.195
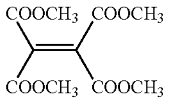
No.196
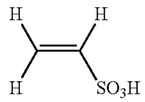
No.197
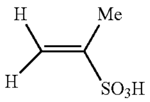
No.198
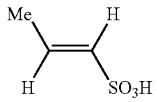
No.199
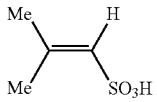
No.200
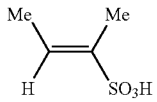
No.201
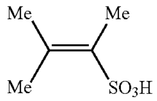
No.202
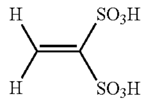
No.203
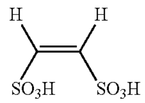
-continued
No.204
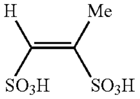
No.205
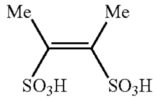
No.206
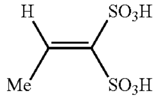
No.207
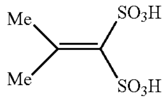
No.208
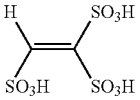
No.209
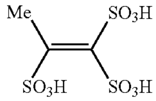
No.210
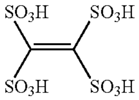
No.211
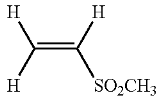
No.212
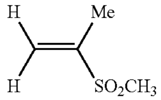
No.213
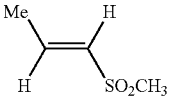
No.214
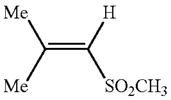
No.215
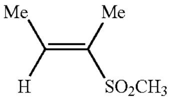
No.216
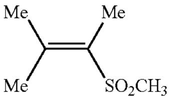
No.217
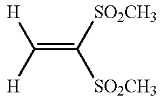

-continued

No.218

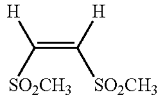

No.219

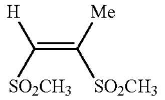

No.220

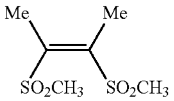

No.221

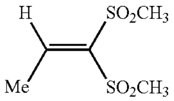

No.222

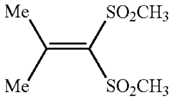

No.223

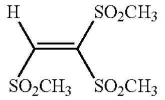

No.224

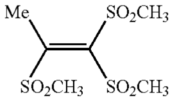

No.225

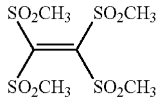

The compound represented by the general formula (1) is not particularly limited by a production method therefor, and may be produced by a well-known synthesis method. For example, Compound No. 135 may be obtained by dibrominating malononitrile with bromine, followed by reductive dimerization with copper powder.

As a compound having two electron-withdrawing groups, there are given Compounds No. 7 to No. 12, No. 22 to No. 27, No. 37 to No. 42, No. 52 to No. 57, No. 67 to No. 72, No. 82 to No. 87, No. 97 to No. 102, No. 112 to No. 117, No. 127 to No. 132, No. 142 to No. 147, No. 157 to No. 162, No. 172 to No. 177, No. 187 to No. 192, No. 202 to No. 207, and No. 217 to No. 222.

As a compound having three or more electron-withdrawing groups, there are given Compounds No. 13 to No. 15, No. 28 to No. 30, No. 43 to No. 45, No. 58 to No. 60, No. 73 to No. 75, No. 88 to No. 90, No. 103 to No. 105, No. 118 to No. 120, No. 133 to No. 135, No. 148 to No. 150, No. 163 to No. 165, No. 178 to No. 180, No. 193 to No. 195, No. 208 to No. 210, and No. 223 to No. 225.

Of those, Compound No. 43 and Compound No. 135 are preferred from the viewpoint that the effects of the present invention become remarkable.

Next, the compound represented by the general formula (2) is described.

Examples of the hydrocarbon group having 1 to 4 carbon atoms represented by each of $R^5$ and $R^6$ in the general formula (2) include the same groups as those represented by each of $R^1$, $R^2$, $R^3$, and $R^4$ in the general formula (1).

Examples of the electron-withdrawing group represented by each of $R^5$ and $R^6$ in the general formula (2) include the same groups as those represented by each of $R^1$, $R^2$, $R^3$, and $R^4$ in the general formula (1).

Preferred specific examples of the compound represented by the general formula (2) include Compounds No. 226 to No. 270 below. However, the present invention is not limited to those compounds.

No.226

No.227

No.228

No.229

No.230

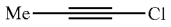

No.231

No.232

No.233

No.234

No.235

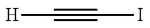

No.236

No.237

No.238

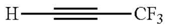

No.239

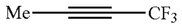

No.240

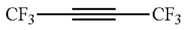

No.241

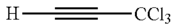

No.242

No.243

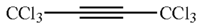

No.244

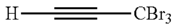

No.245

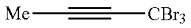

No.246

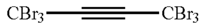

No.247

No.248

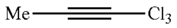

No.249

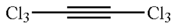

No.250

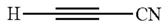

No.251

No.252

No.253

No.254

No.255

No.256

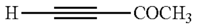

No.257

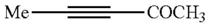

-continued

No.258

$COCH_3 \text{—} \equiv \text{—} COCH_3$

No.259

$H \text{—} \equiv \text{—} COOH$

No.260

$Me \text{—} \equiv \text{—} COOH$

No.261

$COOH \text{—} \equiv \text{—} COOH$

No.262

$H \text{—} \equiv \text{—} COOCH_3$

No.263

$Me \text{—} \equiv \text{—} COOCH_3$

No.264

$COOCH_3 \text{—} \equiv \text{—} COOCH_3$

No.265

$H \text{—} \equiv \text{—} SO_3H$

No.266

$Me \text{—} \equiv \text{—} SO_3H$

No.267

$SO_3H \text{—} \equiv \text{—} SO_3H$

No.268

$H \text{—} \equiv \text{—} SO_2CH_3$

No.269

$Me \text{—} \equiv \text{—} SO_2CH_3$

No.270

$SO_2CH_3 \text{—} \equiv \text{—} SO_2CH_3$

The compound represented by the general formula (2) is not particularly limited by a production method therefor, and may be produced by a well-known synthesis method. For example, Compound No. 232 may be obtained by heating and stirring 1,2-dibromoethane in a mixed solvent of ethanol and water in the presence of sodium hydroxide.

At least one of $R^5$ or $R^6$ in the general formula (2) represents the electron-withdrawing group, and both of $R^5$ and $R^6$ may represent the electron-withdrawing groups. When both of $R^5$ and $R^6$ represent the electron-withdrawing groups, the electron-withdrawing groups may be the same electron-withdrawing group, or may be different electron-withdrawing groups. Examples of the compound in which both of $R^5$ and $R^6$ represent the electron-withdrawing groups include Compounds No. 228, No. 231, No. 234, No. 237, No. 240, No. 243, No. 246, No. 249, No. 252, No. 255, No. 258, No. 261, No. 264, No. 267, and No. 270.

The reactive material of the present invention contains the compound represented by the general formula (1) or the general formula (2). The reactive material of the present invention may be a reactive material consisting only of the compound represented by the general formula (1), or may be a reactive material consisting only of the compound represented by the general formula (2), or may also be a mixture of the compound represented by the general formula (1) and the compound represented by the general formula (2). In addition, the reactive material of the present invention may further include a reactant to be used for the formation of a thin-film, such as water vapor, nitrogen, oxygen, ozone, or hydrogen.

When the reactive material of the present invention is a mixture of the compound represented by the general formula (1) and the compound represented by the general formula (2), the content of the compound represented by the general formula (1) is preferably 60 parts by mass or more, more preferably 80 parts by mass or more, still more preferably 90 parts by mass or more, most preferably 98 parts by mass or more with respect to 100 parts by mass of the total of the compound represented by the general formula (1) and the compound represented by the general formula (2) from the viewpoint that a metallic ruthenium thin-film containing a small amount of ruthenium oxide is easily formed. The reactive material of the present invention preferably contains only the compound represented by the general formula (1) from the viewpoint that a metallic ruthenium thin-film containing a small amount of ruthenium oxide is easily formed.

From the viewpoint that a metallic ruthenium thin-film containing a small amount of ruthenium oxide is easily formed, the total content of the compound represented by the general formula (1) and the compound represented by the general formula (2) is preferably 60 vol % or more, more preferably 70 vol % or more, still more preferably 90 vol % or more, yet still more preferably 98 vol % or more, most preferably 99 vol % or more with respect to the entirety of the reactive material.

Next, a method of producing a thin-film of the present invention is described. The method of producing a thin-film of the present invention includes forming a metallic ruthenium thin-film through use of the above-mentioned reactive material by an atomic layer deposition method.

The method of producing a thin-film of the present invention preferably includes: a step (precursor thin-film formation step) of forming a precursor thin-film through use of a thin-film forming raw material containing an organoruthenium compound; and a step (thin-film formation step) of forming a metallic ruthenium thin-film by causing the precursor thin-film to react with the above-mentioned reactive material. The inclusion of those steps is preferred because a high-quality metallic ruthenium thin-film containing a small amount of ruthenium oxide and a small amount of residual carbon is easily formed.

Now, the thin-film forming raw material to be used in the method of producing a thin-film of the present invention is described.

Thin-Film Forming Raw Material

The thin-film forming raw material to be used in the precursor thin-film formation step contains an organoruthenium compound.

Any organoruthenium compound known as a thin-film forming raw material may be used as the organoruthenium compound in the thin-film forming raw material without particular limitations, but the organoruthenium compound is preferably selected from the group consisting of: an organoruthenium compound represented by the following general formula (3); an organoruthenium compound represented by the following general formula (4); and an organoruthenium compound represented by the following general formula (5) from the viewpoint that the effects of the present invention become remarkable.

$$Ru(L^1)_3 \quad (3)$$

$$Ru(L^1)_n(X)_{2-n}(L^2)_m \quad (4)$$

$$Ru(L^3)_y(L^4)_z(L^2)_m \quad (5)$$

In the general formulae (3), (4), and (5), $L^1$ represents a covalent bonding ligand selected from the group consisting of: an aminoalkoxy group; an amidinate group; a β-diketonate group; a β-ketoiminate group; a β-diketiminate group; a group having a structure of a 2,4-pentadienyl group; and a group having a structure of a cyclopentadienyl group, X represents a halogen atom, "n" represents an integer of from 0 to 2, $L^2$ represents an electron-donating ligand selected from the group consisting of: a carbonyl group; a cyano group; a trialkylphosphine compound; and an isocyanide compound, "m" represents an integer of from 0 to 3, $L^3$ represents an electron-donating ligand selected from the group consisting of: a chain diene compound; a cyclic diene compound; a chain polyene compound; and a cyclic polyene compound, "y" represents 1 or 2, $L^4$ represents an electron-donating ligand formed of an arene compound, and "z" represents 0 or 1.

Examples of the aminoalkoxy group serving as the covalent bonding ligand represented by $L^1$ in each of the general formulae (3) and (4) include an aminomethoxy group, a methylaminomethoxy group, a dimethylaminomethoxy group, an ethylmethylaminomethoxy group, a diethylaminomethoxy group, a 2-aminoethoxy group, a 2-(methylamino)ethoxy group, a 2-(dimethylamino)ethoxy group, a 2-(ethylmethyl)aminoethoxy group, a 2-(diethylamino) ethoxy group, a (1-(dimethylamino)propan-2-yl)oxy group, a (1-(ethylmethylamino)propan-2-yl)oxy group, a (1-(dimethylamino)propan-2-yl)oxy group, a (1-(ethylmethylamino)propan-2-yl)oxy group, a 1-(dimethylamino)2-methylpropan-2-yl)oxy group, a (1-(diethylamino)propan-2-yl) oxy group, a (1-(dimethylamino)propan-2-yl)oxy group, a (1-(ethylmethylamino)propan-2-yl)oxy group, a (1-(diethylamino)propan-2-yl)oxy group, a 3-(dimethylamino)propoxy group, an (ethylmethylamino)propoxy group, a (diethylamino)propoxy group, a (4-(dimethylamino)butan-2-yl)oxy group, a (4-(ethylmethylamino)butan-2-yl)oxy group, a (4-(diethylamino)butan-2-yl)oxy group, a 4-(dimethylamino)-2-methylbutan-2-yl)oxy group, a 4-(ethylmethylamino)-2-methylbutan-2-yl)oxy group, and a 4-(diethylamino)-2-methylbutan-2-yl)oxy group.

Examples of the amidinate group serving as the covalent bonding ligand represented by $L^1$ in each of the general formulae (3) and (4) include an N,N'-dimethylacetamidinate group, an N,N'-diethylacetamidinate group, an N,N'-diisopropylacetamidinate group, an N,N'-n-propylacetamidinate group, an N,N'-di-tert-butylethylpropioamidinate group, an N,N'-trifluoromethylbenzamidinate group, an N,N'-diphenylbenzamidinate group, and an N,N'-ditrimethylsilylbenzamidinate group.

Examples of the β-diketonate group serving as the covalent bonding ligand represented by $L^1$ in each of the general formulae (3) and (4) include an acetylacetonate group, a trifluoroacetylacetonate group, a hexafluoroacetylacetonate group, a dimethylheptanedionate group, a tetramethylheptanedionate group, a heptafluorodimethyloctanedionate group, a tetradecafluorononanedionate group, a trifluorodimethylhexanedionate group, an octafluorohexanedionate group, a pentafluorodimethylheptanedionate group, a decafluoroheptanedionate group, a dimethylmethoxyoctanedionate group, a trichloropentanedionate group, and a diphenylpropanedionate group.

Examples of the β-ketoiminate group serving as the covalent bonding ligand represented by $L^1$ in each of the general formulae (3) and (4) include β-ketoiminates described in JP 2002-533910 A, JP 2002-302473 A, and JP 2011-061208 A.

Examples of the β-diketiminate group serving as the covalent bonding ligand represented by $L^1$ in each of the general formulae (3) and (4) include β-diketiminates described in JP 8-36420 A and the like.

Examples of the group having a structure of a 2,4-pentadienyl group serving as the covalent bonding ligand represented by $L^1$ in each of the general formulae (3) and (4) include a hexa-2,4-dienyl group, a 4-methylhexa-2,4-dienyl group, a 2,4-dimethylpenta-2,4-dienyl group, a 2,4-diethylpenta-2,4-dienyl group, and a 2,4-diisopropylpenta-2,4-dienyl group.

Examples of the group having a structure of a cyclopentadienyl group serving as the covalent bonding ligand represented by $L^1$ in each of the general formulae (3) and (4) include a cyclopentadienyl group, a methylpentadienyl group, an ethylcyclopentadienyl group, and a pentamethylcyclopentadienyl group.

Examples of the halogen atom represented by X in the general formula (4) include a fluorine atom, a chlorine atom, a bromine atom, and an iodine atom.

Examples of the trialkylphosphine compound serving as the electron-donating ligand represented by $L^2$ in each of the general formulae (4) and (5) include trimethylphosphine, triethylphosphine, tri-tert-butylphosphine, and tricyclohexylphosphine.

The isocyanide compound serving as the electron-donating ligand represented by $L^2$ in each of the general formulae (4) and (5) represents a group having the structure $R^7$—N≡C, where $R^7$ represents a linear or branched alkyl group having 1 to 6 carbon atoms or a cycloalkyl group having 3 to 6 carbon atoms.

Examples of the linear or branched alkyl group having 1 to 6 carbon atoms represented by $R^7$ include a methyl group, an ethyl group, a propyl group, an isopropyl group, a butyl group, an isobutyl group, a sec-butyl group, a tert-butyl group, a pentyl group, and a hexyl group.

Examples of the cycloalkyl group having 3 to 6 carbon atoms represented by $R^7$ include a cyclopropyl group, a cyclobutyl group, a cyclopentyl group, and a cyclohexyl group.

Examples of the chain diene compound serving as the electron-donating ligand represented by $L^3$ in the general formula (5) include 1,3-butadiene, 2-methyl-1,3-butadiene, 2,3-dimethyl-1,3-butadiene, 1,3-pentadiene, 2-methyl-1,3-pentadiene, 2,3-dimethyl-1,3-pentadiene, 2,4-dimethyl-1,3-pentadiene, 2,4-hexadiene, 3-methyl-1,3-pentadiene, 2-ethyl-1,3-butadiene, 1,3-hexadiene, 1,3-heptadiene, 1,3-octadiene, 1,3-nonadiene, 1,3-decadiene, 2-isopropyl-2,3-butadiene, and 2-cyclohexyl-1,3-butadiene.

Examples of the cyclic diene compound serving as the electron-donating ligand represented by $L^3$ in the general formula (5) include 1,3-cyclohexadiene, 1,4-cyclohexadiene, 1-methyl-1,3-cyclohexadiene, 2-methyl-1,3-cyclohexadiene, 1-ethyl-1,3-cyclohexadiene, 2-ethyl-1,3-cyclohexadiene, 1-propyl-1,3-cyclohexadiene, 2-propyl-1,3-cyclohexadiene, 1-isopropyl-1,3-cyclohexadiene, 2-isopropyl-1,3-cyclohexadiene, 1-butyl-1,3-cyclohexadiene, 2-butyl-1,3-cyclohexadiene, 1-isobutyl-1,3-cyclohexadiene, 2-isobutyl-1,3-cyclohexadiene, 1-sec-butyl-1,3-cyclohexadiene, 2-sec-butyl-1,3-cyclohexadiene, 1-tert-butyl-1,3-cyclohexadiene, 2-tert-butyl-1,3-cyclohexadiene, 1-pentyl-1,3-cyclohexadiene, 2-pentyl-1,3-cyclohexadiene, 1-hexyl-1,3-cyclohexadiene, 2-hexyl-1,3-cyclohexadiene, 1-cyclohexyl-1,3-cyclohexadiene, 2-cyclohexyl-1,3-cyclohexadiene, α-phellandrene, α-terpinene, γ-terpinene, norbornadiene, 1,5-cyclooctadiene, and 1,5-dimethyl-1,5-cyclooctadiene.

In the present invention, the polyene compound refers to a carbon compound having three or more carbon-carbon double bonds in one molecule. Examples of the chain polyene compound serving as the electron-donating ligand represented by $L^3$ in the general formula (5) include 1,3,5-hexatriene and 1,3,5-heptatriene. Examples of the cyclic polyene compound serving as the electron-donating ligand represented by $L^3$ in the general formula (5) include cycloheptatriene, cyclooctatriene, and cyclooctatetraene.

Examples of the arene compound serving as the electron-donating ligand represented by $L^4$ in the general formula (5)

include toluene, benzene, o-xylene, m-xylene, p-xylene, mesitylene, fluorobenzene, o-difluorobenzene, p-difluorobenzene, chlorobenzene, pentafluorobenzene, o-dichlororbenzene, and hexafluorobenzene.

From the viewpoint that the effects of the present invention become remarkable, an organoruthenium compound in which $L^1$ in the general formula (3) represents an amidinate group, a β-diketonate group, a β-ketoiminate group, a β-diketiminate group, a 2,4-pentadienyl group, or a cyclopentadienyl group is preferred, and an organoruthenium compound in which $L^1$ in the general formula (3) represents a β-diketonate group, a β-ketoiminate group, or a β-diketiminate group is more preferred.

Preferred specific examples of the organoruthenium compound represented by the general formula (3) include Compounds No. 271 to No. 275 below. However, the present invention is not limited to those organoruthenium compounds.

No.271

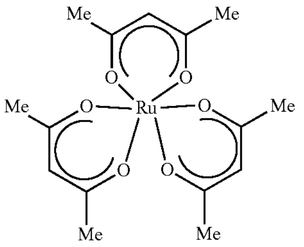

No.272

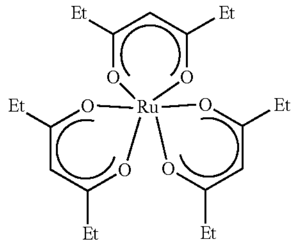

No.273

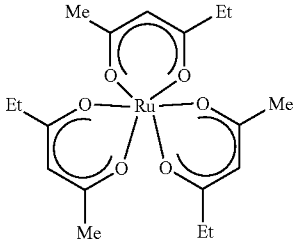

No.274

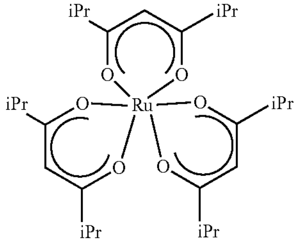

-continued

No.275

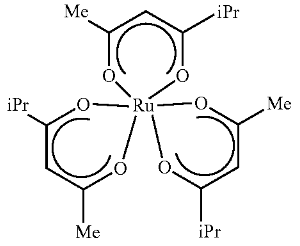

From the viewpoint that the effects of the present invention become remarkable, an organoruthenium compound in which $L^1$ in the general formula (4) represents an amidinate group, a β-diketonate group, a β-ketoiminate group, a β-diketiminate group, a 2,4-pentadienyl group, or a cyclopentadienyl group is preferred, an organoruthenium compound in which $L^1$ in the general formula (4) represents an amidinate group, a β-diketonate group, a β-diketiminate group, a 2,4-pentadienyl group, or a cyclopentadienyl group is more preferred, and an organoruthenium compound in which $L^1$ in the general formula (4) represents a 2,4-pentadienyl group or a cyclopentadienyl group is still more preferred.

From the viewpoint that the effects of the present invention become remarkable, an organoruthenium compound in which X in the general formula (4) represents a chlorine atom is more preferred.

From the viewpoint that the effects of the present invention become remarkable, an organoruthenium compound in which $L^2$ in the general formula (4) represents a carbonyl group, a cyano group, or a trialkylphosphine compound is preferred, and an organoruthenium compound in which $L^2$ in the general formula (4) represents a carbonyl group or a cyano group is more preferred.

From the viewpoint that the effects of the present invention become remarkable, an organoruthenium compound in which "n" in the general formula (4) represents 0 or 2 is preferred, and an organoruthenium compound in which "n" in the general formula (4) represents 2 is more preferred.

From the viewpoint that the effects of the present invention become remarkable, an organoruthenium compound in which "m" in the general formula (4) represents 0 or 2 is preferred, and an organoruthenium compound in which "m" in the general formula (4) represents 2 is more preferred.

Preferred specific examples of the organoruthenium compound represented by the general formula (4) include Compounds No. 276 to No. 305 below. However, the present invention is not limited to those organoruthenium compounds.

No.276

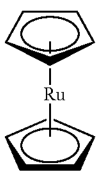

No.277

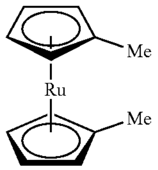

-continued
No.278
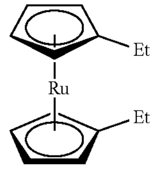
No.279
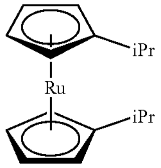
No.280
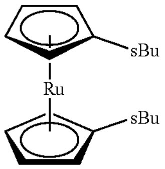
No.281
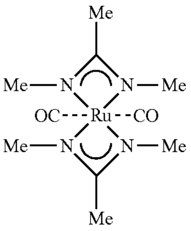
No.282
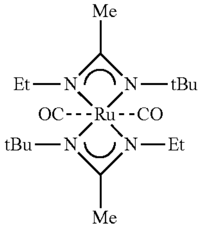
No.283
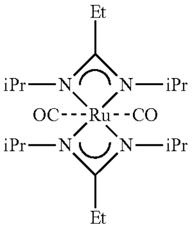
No.284
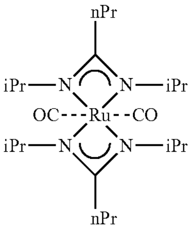
-continued
No.285
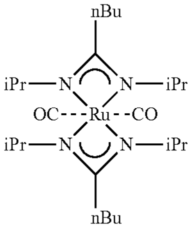
No.286
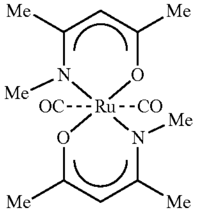
No.287
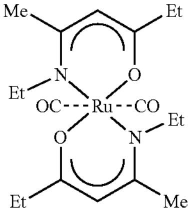
No.288
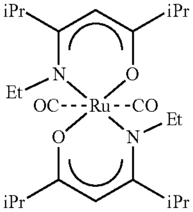
No.289
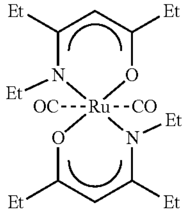
No.290
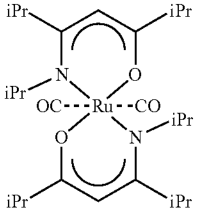
No.291
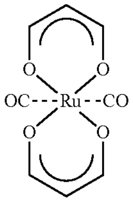

-continued
No.292
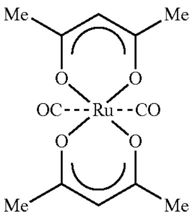
No.293
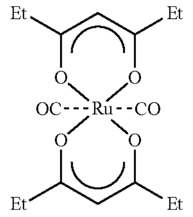
No.294
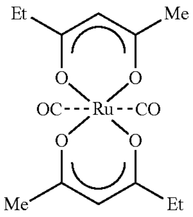
No.295
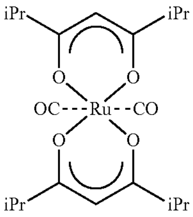
No.296
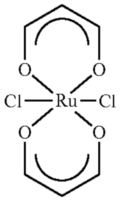
No.297
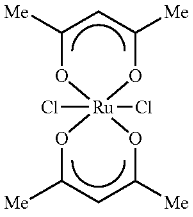
No.298
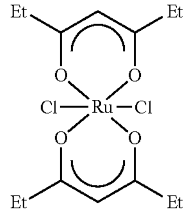
-continued
No.299
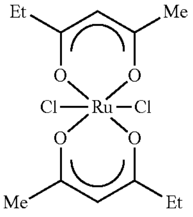
No.300
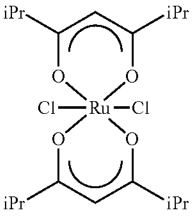
No.301
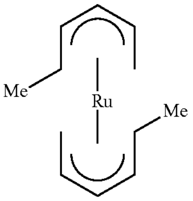
No.302
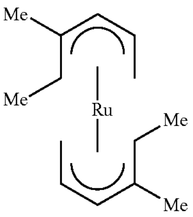
No.303
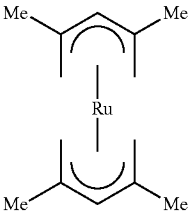
No.304
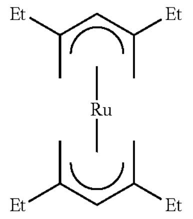
No.305
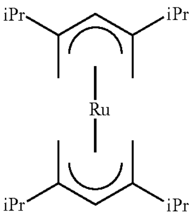
From the viewpoint that the effects of the present invention become remarkable, an organoruthenium compound in which $L^2$ in the general formula (5) represents a carbonyl group, a cyano group, or a trialkylphosphine compound is preferred, and an organoruthenium compound in which $L^2$ in the general formula (5) represents a carbonyl group or a cyano group is more preferred.

From the viewpoint that the effects of the present invention become remarkable, an organoruthenium compound in which $L^3$ in the general formula (5) represents a chain diene compound, a cyclic diene compound, or a cyclic polyene compound is preferred, and an organoruthenium compound in which $L^3$ in the general formula (5) represents a chain diene compound or a cyclic diene compound is more preferred.

From the viewpoint that the effects of the present invention become remarkable, an organoruthenium compound in which $L^4$ in the general formula (5) represents toluene, benzene, o-xylene, m-xylene, or p-xylene is preferred, and an organoruthenium compound in which $L^4$ in the general formula (5) represents toluene or benzene is more preferred.

From the viewpoint that the effects of the present invention become remarkable, an organoruthenium compound in which “m” in the general formula (5) represents 0 or 2 is preferred, and an organoruthenium compound in which “m” in the general formula (5) represents 0 is more preferred.

From the viewpoint that the effects of the present invention become remarkable, an organoruthenium compound in which “y” in the general formula (5) represents 1 or 2 is preferred, and an organoruthenium compound in which “y” in the general formula (5) represents 1 is more preferred.

From the viewpoint that the effects of the present invention become remarkable, an organoruthenium compound in which “z” in the general formula (5) represents 0 or 1 is preferred, and an organoruthenium compound in which “z” in the general formula (5) represents 0 is more preferred.

Preferred specific examples of the organoruthenium compound represented by the general formula (5) include Compounds No. 306 to No. 318 below. However, the present invention is not limited to those organoruthenium compounds.

No.306

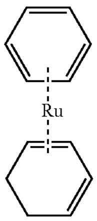

No.307

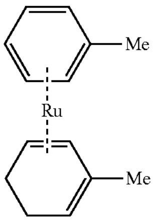

No.308

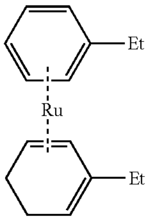

-continued

No.309

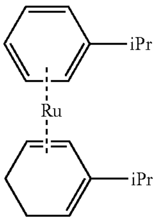

No.310

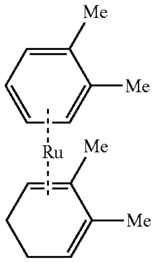

No.311

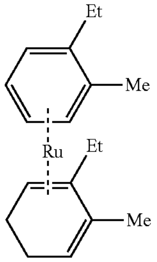

No.312

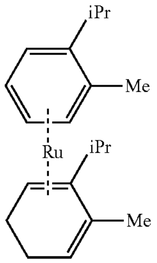

No.313

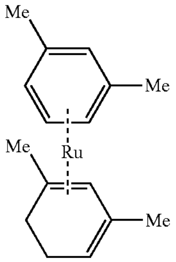

No.314

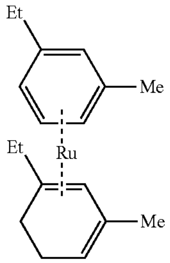

-continued

No.315

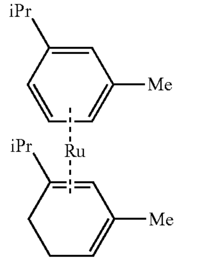

No.316

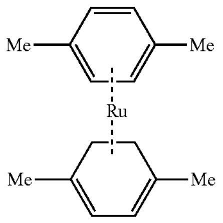

No.317

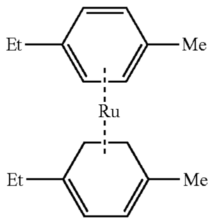

No.318

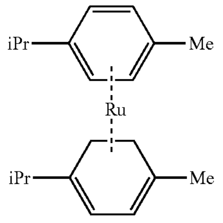

In the method of producing a thin-film of the present invention, the organoruthenium compound may be used without limitations on its structure, and a mixture of the organoruthenium compounds may be used. However, from the viewpoint that the effects of the present invention become remarkable, a thin-film forming raw material containing the organoruthenium compound represented by the general formula (4) or the organoruthenium compound represented by the general formula (5) is preferably used, a thin-film forming raw material containing an organoruthenium compound selected from Compounds No. 281 to No. 318 is more preferably used, and a thin-film forming raw material containing an organoruthenium compound selected from Compounds No. 303 to No. 309 and No. 316 to No. 318 is most preferably used.

The thin-film forming raw material containing the organoruthenium compound only needs to contain the organoruthenium compound as a precursor of a thin-film, and the composition thereof varies depending on the kind of the target thin-film. For example, when a thin-film containing only a ruthenium atom as a metal is produced, the thin-film forming raw material is free of a metal compound other than ruthenium and a semimetal compound. Meanwhile, when a thin-film containing a ruthenium atom and a metal other than the ruthenium atom and/or a semimetal is produced, the thin-film forming raw material may contain, in addition to the organoruthenium compound, a compound containing a desired metal and/or a compound containing a semimetal (hereinafter sometimes referred to as "other precursor").

In the case of a multi-component ALD method in which a plurality of precursors are used, there is no particular limitation on the other precursor that may be used together with the organoruthenium compound, and a well-known general precursor used for the thin-film forming raw material for an ALD method may be used.

Examples of the above-mentioned other precursor include compounds each containing: one kind or two or more kinds selected from the group consisting of compounds used as organic ligands, such as an alcohol compound, a glycol compound, a β-diketone compound, a cyclopentadiene compound, and an organic amine compound; and silicon or a metal. In addition, examples of the kind of the metal in the precursor include lithium, sodium, potassium, magnesium, calcium, strontium, barium, titanium, zirconium, hafnium, vanadium, niobium, tantalum, chromium, molybdenum, tungsten, manganese, iron, osmium, ruthenium, cobalt, rhodium, iridium, nickel, palladium, platinum, copper, silver, gold, zinc, aluminum, gallium, indium, germanium, lead, antimony, bismuth, radium, scandium, ruthenium, yttrium, lanthanum, cerium, praseodymium, neodymium, promethium, samarium, europium, gadolinium, terbium, dysprosium, holmium, erbium, thulium, ytterbium, and lutetium.

Examples of the alcohol compound to be used as the organic ligand in the above-mentioned other precursor include: alkyl alcohols, such as methanol, ethanol, propanol, isopropyl alcohol, butanol, sec-butyl alcohol, isobutyl alcohol, tert-butyl alcohol, pentyl alcohol, isopentyl alcohol, and tert-pentyl alcohol; ether alcohols, such as 2-methoxyethanol, 2-ethoxyethanol, 2-butoxyethanol, 2-(2-methoxyethoxy)ethanol, 2-methoxy-1-methylethanol, 2-methoxy-1,1-dimethylethanol, 2-ethoxy-1,1-dimethylethanol, 2-isopropoxy-1,1-dimethylethanol, 2-butoxy-1,1-dimethylethanol, 2-(2-methoxyethoxy)-1,1-dimethylethanol, 2-propoxy-1,1-diethylethanol, 2-sec-butoxy-1,1-diethylethanol, and 3-methoxy-1,1-dimethylpropanol; and dialkylamino alcohols, such as dimethylaminoethanol, ethylmethylaminoethanol, diethylaminoethanol, dimethylamino-2-pentanol, ethylmethylamino-2-pentanol, dimethylamino-2-methyl-2-pentanol, ethylmethylamino-2-methyl-2-pentanol, and diethylamino-2-methyl-2-pentanol.

Examples of the glycol compound to be used as the organic ligand in the above-mentioned other precursor include 1,2-ethanediol, 1,2-propanediol, 1,3-propanediol, 2,4-hexanediol, 2,2-dimethyl-1,3-propanediol, 2,2-diethyl-1,3-propanediol, 1,3-butanediol, 2,4-butanediol, 2,2-diethyl-1,3-butanediol, 2-ethyl-2-butyl-1,3-propanediol, 2,4-pentanediol, 2-methyl-1,3-propanediol, 2-methyl-2,4-pentanediol, 2,4-hexanediol, and 2,4-dimethyl-2,4-pentanediol.

Examples of the β-diketone compound to be used as the organic ligand in the above-mentioned other precursor include: alkyl-substituted β-diketones, such as acetylacetone, hexane-2,4-dione, 5-methylhexane-2,4-dione, heptane-2,4-dione, 2-methylheptane-3,5-dione, 5-methylheptane-2,4-dione, 6-methylheptane-2,4-dione, 2,2-dimethylheptane-3,5-dione, 2,6-dimethylheptane-3,5-dione, 2,2,6-trimethylheptane-3,5-dione, 2,2,6,6-tetramethylheptane-3,5-dione, octane-2,4-dione, 2,2,6-trimethyloctane-3,5-dione, 2,6-dimethyloctane-3,5-dione, 2,9-dimethylnonane-4,6-dione, 2-methyl-6-ethyldecane-3,5-dione, and 2,2-dimethyl-6-ethyldecane-3,5-dione; fluorine-substituted alkyl β-diketones, such as 1,1,1-trifluoropentane-2,4-dione, 1,1,1-trifluoro-5,5-dimethylhexane-2,4-dione, 1,1,1,5,5,5-hexafluoropentane-2,4-dione, and 1,3-diperfluorohexylpropane-1,3-dione; and ether-substituted β-diketones, such as 1,1,5,5-tetramethyl-1-methoxyhexane-2,4-dione, 2,2,6,6-tetramethyl-1-methoxyheptane-3,5-dione, and 2,2,6,6-tetramethyl-1-(2-methoxyethoxy)heptane-3,5-dione.

Examples of the cyclopentadiene compound to be used as the organic ligand in the above-mentioned other precursor include cyclopentadiene, methylcyclopentadiene, ethylcyclopentadiene, propylcyclopentadiene, isopropylcyclopentadiene, butylcyclopentadiene, sec-butylcyclopentadiene, isobutylcyclopentadiene, tert-butylcyclopentadiene, dimethylcyclopentadiene, tetramethylcyclopentadiene, and pentamethylcyclopentadiene.

Examples of the organic amine compound to be used as the organic ligand in the above-mentioned other precursor include methylamine, ethylamine, propylamine, isopropylamine, butylamine, sec-butylamine, tert-butylamine, isobutylamine, dimethylamine, diethylamine, dipropylamine, diisopropylamine, ethylmethylamine, propylmethylamine, and isopropylmethylamine.

The above-mentioned other precursors are known in the art, and production methods therefor are also known. For example, a precursor using the alcohol compound as the organic ligand may be produced through a reaction between an inorganic salt of the metal described above or a hydrate thereof and an alkali metal alkoxide of the alcohol compound. In this case, examples of the inorganic salt of the metal or the hydrate thereof may include a halide and a nitrate of the metal. Examples of the alkali metal alkoxide may include a sodium alkoxide, a lithium alkoxide, and a potassium alkoxide.

In the multi-component ALD method as described above, there are adopted: a method involving vaporizing and supplying each component of the thin-film forming raw material independently (hereinafter sometimes referred to as "single source method"); and a method involving vaporizing and supplying a mixed raw material obtained by mixing multi-component raw materials in accordance with desired composition in advance (hereinafter sometimes referred to as "cocktail source method"). In the case of the single source method, the other precursor is preferably a compound similar to the organoruthenium compound in the thin-film forming raw material in the behavior of thermal decomposition and/or oxidative decomposition. In the case of the cocktail source method, the other precursor is preferably a compound that not only is similar to the organoruthenium compound in the thin-film forming raw material in the behavior of thermal decomposition and/or oxidative decomposition but also is prevented from being altered through a chemical reaction or the like at the time of mixing.

In the case of the cocktail source method in the multi-component ALD method, a mixture of the organoruthenium compound and the other precursor, which are to be included in the thin-film forming raw material, or a mixed solution obtained by dissolving the mixture in an organic solvent may be used as the thin-film forming raw material.

There is no particular limitation on the above-mentioned organic solvent, and a well-known general organic solvent may be used. Examples of the organic solvent include: acetic acid esters, such as ethyl acetate, butyl acetate, and methoxyethyl acetate; ethers, such as tetrahydrofuran, tetrahydropyran, ethylene glycol dimethyl ether, diethylene glycol dimethyl ether, triethylene glycol dimethyl ether, dibutyl ether, and dioxane; ketones, such as methyl butyl ketone, methyl isobutyl ketone, ethyl butyl ketone, dipropyl ketone, diisobutyl ketone, methyl amyl ketone, cyclohexanone, and methylcyclohexanone; hydrocarbons, such as hexane, cyclohexane, methylcyclohexane, dimethylcyclohexane, ethylcyclohexane, heptane, octane, toluene, and xylene; hydrocarbons each having a cyano group, such as 1-cyanopropane, 1-cyanobutane, 1-cyanohexane, cyanocyclohexane, cyanobenzene, 1,3-dicyanopropane, 1,4-dicyanobutane, 1,6-dicyanohexane, 1,4-dicyanocyclohexane, and 1,4-dicyanobenzene; and pyridine and lutidine. Those organic solvents may be used alone or as a mixture thereof depending on the solubility of a solute, the relationship among the use temperature, boiling point, and flash point of the solvent, and the like.

When the thin-film forming raw material includes the organic solvent, the amount of the entire precursors in the thin-film forming raw material is controlled to preferably from 0.01 mol/liter to 2.0 mol/liter, more preferably from 0.05 mol/liter to 1.0 mol/liter from the viewpoint that a high-quality metallic ruthenium thin-film containing a small amount of residual carbon is easily formed.

Herein, when the thin-film forming raw material is free of any precursor other than the organoruthenium compound, the amount of the entire precursors refers to the amount of the organoruthenium compound. When the thin-film forming raw material contains any other precursor in addition to the organoruthenium compound, the amount of the entire precursors refers to the total amount of the organoruthenium compound and the other precursor.

In addition, in the method of producing a thin-film of the present invention, the thin-film forming raw material may include a nucleophilic reagent as required in order to improve the stability of each of the organoruthenium compound and the other precursor. Examples of the nucleophilic reagent include: ethylene glycol ethers, such as glyme, diglyme, triglyme, and tetraglyme; crown ethers, such as 18-crown-6, dicyclohexyl-18-crown-6, 24-crown-8, dicyclohexyl-24-crown-8, and dibenzo-24-crown-8; polyamines, such as ethylenediamine, N,N'-tetramethylethylenediamine, diethylenetriamine, triethylenetetramine, tetraethylenepentamine, pentaethylenehexamine, 1,1,4,7,7-pentamethyldiethylenetriamine, 1,1,4,7,10,10-hexamethyltriethylenetetramine, and triethoxytriethyleneamine; cyclic polyamines, such as cyclam and cyclen; heterocyclic compounds, such as pyridine, pyrrolidine, piperidine, morpholine, N-methylpyrrolidine, N-methylpiperidine, N-methylmorpholine, tetrahydrofuran, tetrahydropyran, 1,4-dioxane, oxazole, thiazole, and oxathiolane; pi-keto esters, such as methyl acetoacetate, ethyl acetoacetate, and 2-methoxyethyl acetoacetate; and β-diketones, such as acetylacetone, 2,4-hexanedione, 2,4-heptanedione, 3,5-heptanedione, and dipivaloylmethane. From the viewpoint that the stability is easily controlled, the usage amount of each of those nucleophilic reagents falls within the range of preferably from 0.1 mol to 10 mol, more preferably from 1 mol to 4 mol with respect to 1 mol of the amount of the entire precursors.

It is desired that the thin-film forming raw material be prevented from including impurity metal elements other than the components for forming the raw material, impurity halogens, such as impurity chlorine, and impurity organic substances to the extent possible. The content of each of the impurity metal elements is preferably 100 ppb or less, more preferably 10 ppb or less, and the total content thereof is preferably 1 ppm or less, more preferably 100 ppb or less. In particular, when the raw material is used as a gate insulating film, a gate film, or a barrier layer of an LSI, it is required to reduce the contents of alkali metal elements and alkaline-earth metal elements that influence the electrical characteristics of a thin-film to be obtained. The content of the impurity halogens is preferably 100 ppm or less, more preferably 10 ppm or less, still more preferably 1 ppm or less. The total content of the impurity organic substances is preferably 500 ppm or less, more preferably 50 ppm or less, still more preferably 10 ppm or less. In addition, moisture causes generation of particles in the thin-film forming raw material and generation of particles during thin-film formation. Accordingly, in order to reduce moisture in each of the precursor, the organic solvent, and the nucleophilic reagent, the moisture is preferably removed as much as possible in advance at the time of use. The moisture content of each of the precursor, the organic solvent, and the nucleophilic reagent is preferably 10 ppm or less, more preferably 1 ppm or less. In the method of producing a thin-film of the present invention, when the contents of the impurity metal elements, the impurity halogens, the impurity organic substances, and the moisture in the thin-film forming raw material are set to be equal to or less than the above-mentioned numerical values, a high-quality metallic ruthenium thin-film containing a small amount of residual carbon is easily formed.

In addition, it is preferred that the thin-film forming raw material be prevented from including particles to the extent possible in order to reduce or prevent particle contamination of a thin-film to be formed. Specifically, from the viewpoint that a uniform thin-film is easily obtained, in particle measurement with a light scattering liquid particle detector in a liquid phase, it is preferred that the number of particles larger than 0.3 μm be 100 or less in 1 ml of the thin-film forming raw material, and it is more preferred that the number of particles larger than 0.2 μm be 100 or less in 1 ml of the thin-film forming raw material.

In the method of producing a thin-film of the present invention, the precursor thin-film formation step and the thin-film formation step are preferably performed in a film formation chamber (hereinafter sometimes referred to as "deposition reaction portion") having a substrate set therein.

In addition, the method of producing a thin-film of the present invention preferably includes, after the precursor thin-film formation step, a step (first evacuation step) of evacuating the undeposited thin-film forming raw material from the film formation chamber.

The method of producing a thin-film of the present invention preferably further includes, after the thin-film formation step, a step (second evacuation step) of evacuating the unreacted reactive material from the film formation chamber.

From the viewpoint that a high-quality metallic ruthenium thin-film containing a small amount of ruthenium oxide and a small amount of residual carbon is easily formed, it is preferred that the precursor thin-film formation step, the first evacuation step, the thin-film formation step, and the second evacuation step be performed repeatedly.

Now, each of the steps of the method of producing a thin-film of the present invention is described.

Precursor Thin-Film Formation Step

The precursor thin-film formation step is a step of forming a precursor thin-film through use of a thin-film forming raw material containing an organoruthenium compound.

In this step, any method capable of forming a precursor thin-film having a desired thickness may be adopted as a method of forming the precursor thin-film through use of the thin-film forming raw material. An example thereof is a method involving depositing a raw material gas obtained by vaporizing the thin-film forming raw material containing the organoruthenium compound on the surface of the substrate. More specifically, the raw material gas obtained by vaporizing the thin-film forming raw material is introduced into the film formation chamber having the substrate set therein, and the raw material gas is deposited on the surface of the substrate, to thereby form the precursor thin-film.

Figure 2:
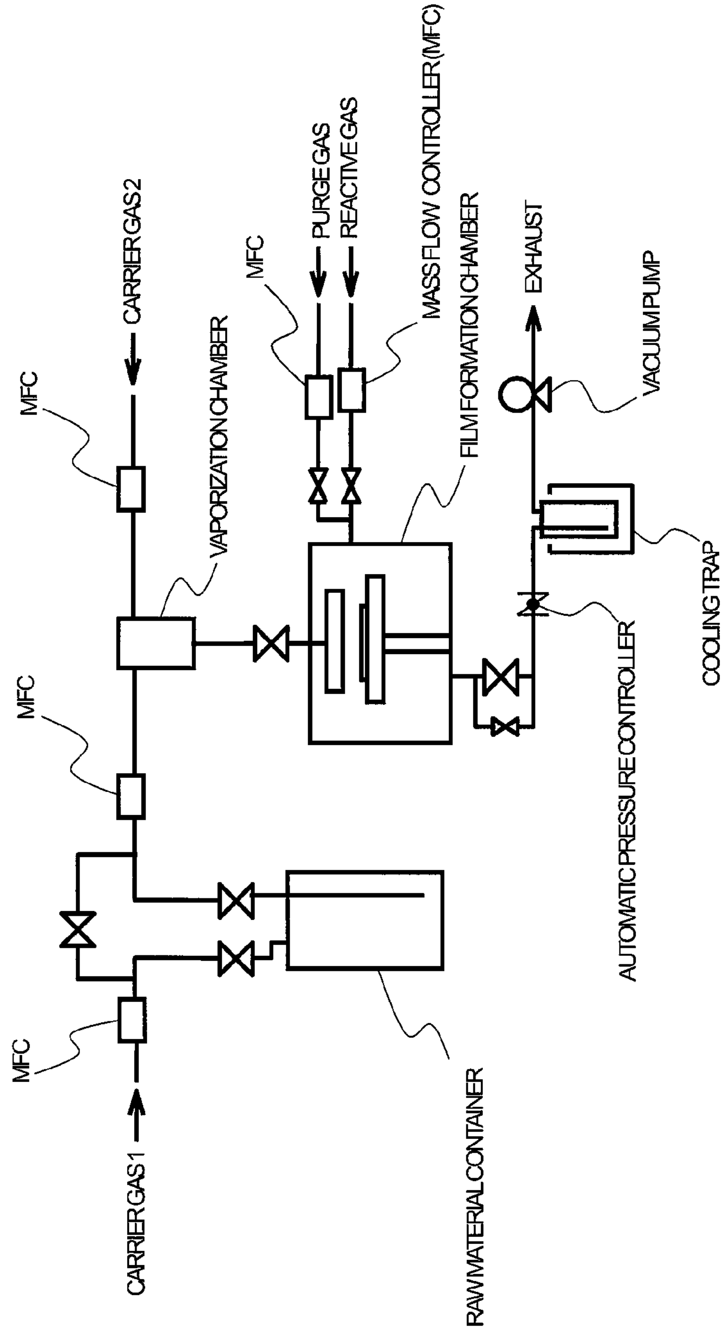
FIG. 2 is a schematic diagram for illustrating another example of the ALD apparatus to be used in the method of producing a thin-film of the present invention.
Figure 3:
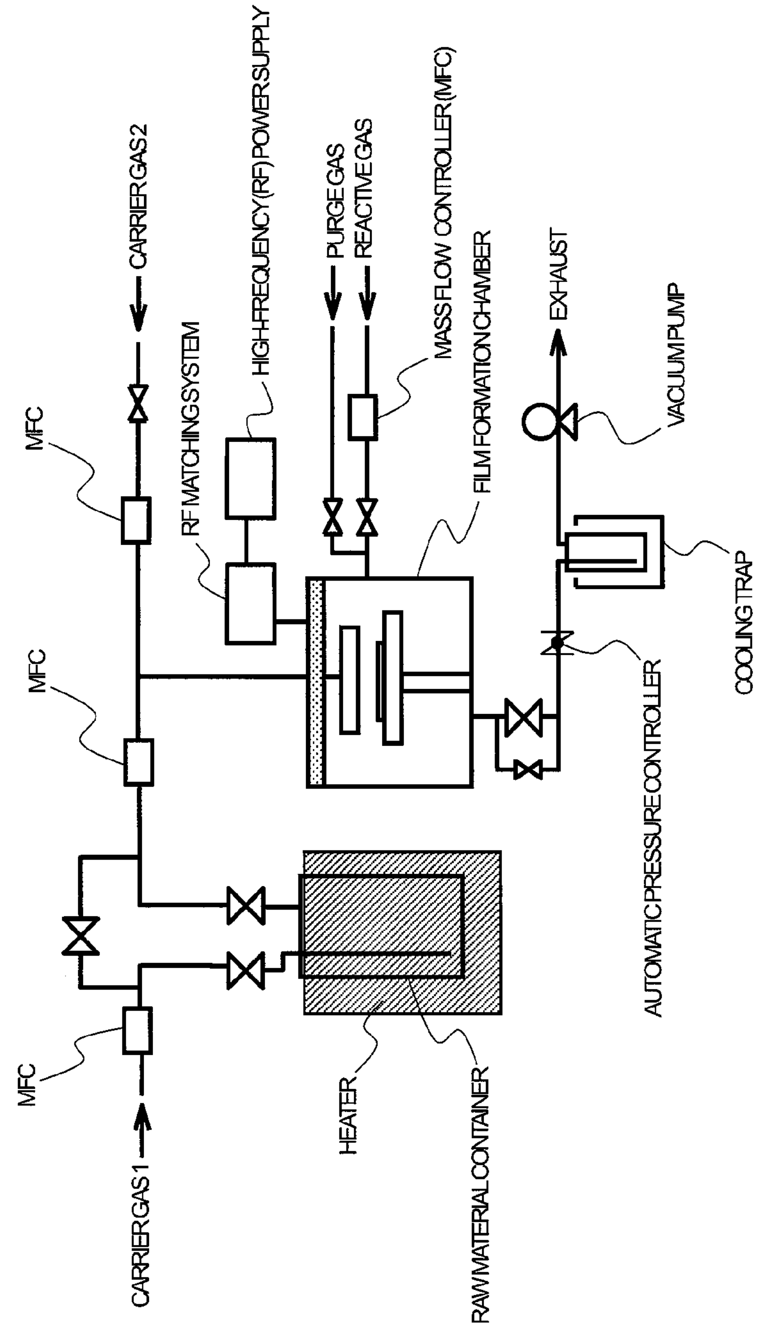
FIG. 3 is a schematic diagram for illustrating another example of the ALD apparatus to be used in the method of producing a thin-film of the present invention.
Figure 4:
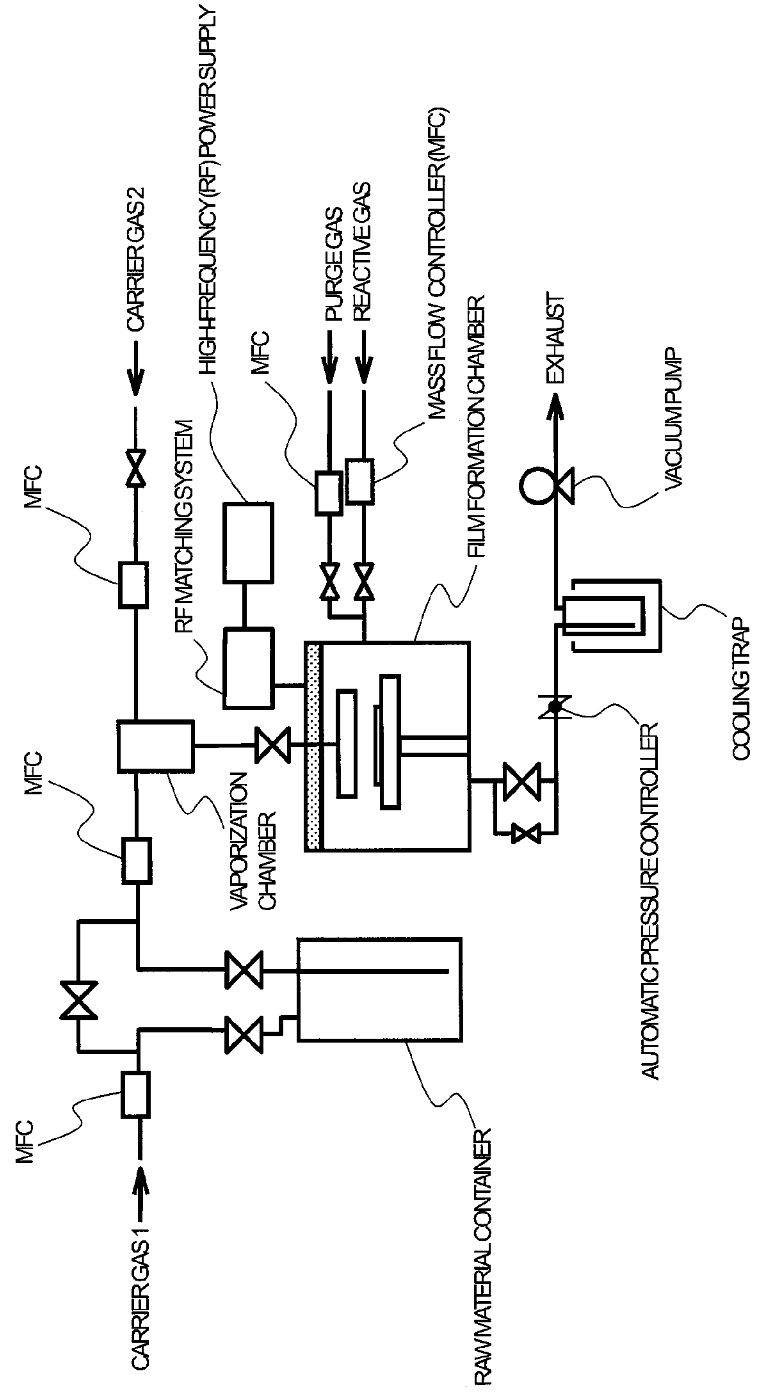
FIG. 4 is a schematic diagram for illustrating another example of the ALD apparatus to be used in the method of producing a thin-film of the present invention.

As a method of introducing the raw material gas obtained by vaporizing the thin-film forming raw material into the film formation chamber having the substrate set therein, there are given: a gas transportation method as illustrated in each of FIG. 1 and FIG. 3 including heating and/or decompressing an inside of a raw material container having stored therein the thin-film forming raw material to vaporize the thin-film forming raw material, to thereby obtain a raw material gas, and introducing the raw material gas into a film formation chamber having a substrate set therein together with a carrier gas, such as argon, nitrogen, or helium, as required, and a liquid transportation method as illustrated in each of FIG. 2 and FIG. 4 including transporting the thin-film forming raw material to a vaporization chamber under a state of a liquid or a solution, heating and/or decompressing an inside of the vaporization chamber to vaporize the thin-film forming raw material, to thereby obtain a raw material gas, and introducing the raw material gas into a film formation chamber having a substrate set therein. In the case of the gas transportation method, the very organoruthenium compound may be used as the thin-film forming raw material. In the case of the liquid transportation method, the very organoruthenium compound or a solution obtained by dissolving the organoruthenium compound in an organic solvent may be used as the thin-film forming raw material. Those thin-film forming raw materials may each further include a nucleophilic reagent and the like.

In addition, the single source method and the cocktail source method, which have been described above as the multi-component ALD methods each including a plurality of precursors, may also be given as examples of the method used in the precursor thin-film formation step, in addition to the gas transportation method and the liquid transportation method. However, no matter which one of the introduction methods is used, the thin-film forming raw material is preferably vaporized in the range of from 50° C. to 200° C. from the viewpoint of handleability. In addition, when the thin-film forming raw material is vaporized to provide the raw material gas in the raw material container or in the vaporization chamber, a pressure in the raw material container or in the vaporization chamber is preferably from 1 Pa to 10,000 Pa from the viewpoint that the thin-film forming raw material is easily vaporized.

As a material for the substrate to be set in the film formation chamber, there are given, for example: silicon; ceramics, such as silicon nitride, titanium nitride, tantalum nitride, titanium oxide, ruthenium oxide, zirconium oxide, hafnium oxide, and lanthanum oxide; glass; and metals, such as metallic cobalt and metallic ruthenium. The shape of the substrate is, for example, a plate shape, a spherical shape, a fibrous shape, or a scaly shape. The surface of the substrate may be planar, or may have a three-dimensional structure, such as a trench structure.

After the raw material gas is introduced into the film formation chamber, the raw material gas can be deposited on the surface of the substrate, to thereby form the precursor thin-film on the surface of the substrate. When the precursor thin-film is formed by depositing the raw material gas on the surface of the substrate, the substrate may be heated, or an inside of the film formation chamber may be heated. The conditions under which the precursor thin-film is formed are not particularly limited, and for example, a deposition temperature (substrate temperature), a pressure in the film formation chamber, and the like may be appropriately determined depending on the kind of the thin-film forming raw material. From the viewpoint that a uniform precursor thin-film is easily obtained, the precursor thin-film formation step is performed under a state in which the substrate is heated to preferably 100° C. or more, more preferably from 100° C. to 450° C., most preferably from 150° C. to 300° C. The pressure in the film formation chamber is not particularly limited, but is preferably from 1 Pa to 10,000 Pa, more preferably from 10 Pa to 1,000 Pa from the viewpoint that a uniform precursor thin-film is easily obtained.

First Evacuation Step

The first evacuation step is a step of evacuating the thin-film forming raw material not having been deposited on the surface of the substrate from the film formation chamber. In the first evacuation step, it is ideal that the thin-film forming raw material (raw material gas) not having been deposited on the surface of the substrate be completely evacuated from the film formation chamber, but it is not always required that the raw material be completely evacuated. As an evacuation method, there are given, for example: a method involving purging an inside of the film formation chamber with an inert gas, such as helium, nitrogen, or argon, a method involving performing evacuation by decompressing an inside of the film formation chamber; and a combination of these methods. The degree of decompression in the case of decompressing the inside of the film formation chamber falls within the range of preferably from 0.01 Pa to 300 Pa, more preferably from 0.01 Pa to 100 Pa from the viewpoint that the evacuation of the raw material gas is promoted.

Thin-Film Formation Step

The thin-film formation step is a step of forming a metallic ruthenium thin-film by causing the precursor thin-film to react with the reactive material. Herein, the phrase "causing the precursor thin-film to react with the reactive material" refers to a case in which the organoruthenium compound in the precursor thin-film and the compound represented by the general formula (1) or the compound represented by the general formula (2) in the reactive material are caused to react with each other.

In this step, for example, a method involving bringing the precursor thin-film into contact with a reactive gas obtained by vaporizing the reactive material may be used. When the precursor thin-film is brought into contact with the reactive gas, the precursor thin-film can be caused to react with the reactive gas, to thereby form a metallic ruthenium thin-film on the surface of the substrate. Specifically, after the first evacuation step, the reactive gas is introduced into the film formation chamber to cause a reaction between the organoruthenium compound in the precursor thin-film and the compound represented by the general formula (1) or the compound represented by the general formula (2) in the reactive gas through the action of the reactive gas and the action of heat. Thus, the metallic ruthenium thin-film can be formed.

The reactive material to be used in the thin-film formation step only needs to contain the compound represented by the general formula (1) or the compound represented by the general formula (2). The reactive material may contain two or more kinds of the compounds represented by the general formula (1) or the compounds represented by the general formula (2), or may be a mixture of the compound represented by the general formula (1) and the compound represented by the general formula (2). The reactive gas obtained by vaporizing the reactive material may be mixed with a gas selected from the group consisting of: argon; nitrogen; oxygen; and hydrogen as required. In addition, the reactive gas may include an oxidizing gas, such as oxygen, water vapor, or ozone, or a reducing gas, such as ammonia, hydrogen, monosilane, or hydrazine, to the extent that the effects of the present invention are not adversely affected. From the viewpoint that the effects of the present invention become remarkable, the reactive material to be used in the method of producing a thin-film of the present invention preferably contains the compound represented by the general formula (1), and more preferably contains Compound No. 43 or No. 135.

When the precursor thin-film is caused to react with the reactive material, a reaction temperature (substrate temperature) is preferably 100° C. or more, more preferably from 100° C. to 450° C., still more preferably from 100° C. to 300° C., most preferably from 150° C. to 300° C. from the viewpoint that a high-quality metallic ruthenium thin-film containing a smaller amount of residual carbon is obtained. In addition, the pressure in the film formation chamber at the time of performing the thin-film formation step is preferably from 1 Pa to 10,000 Pa, more preferably from 10 Pa to 1,000 Pa from the viewpoint that reactivity between the precursor thin-film and the reactive gas becomes satisfactory.

Second Evacuation Step

The method of producing a thin-film of the present invention preferably includes, after the thin-film formation step, a second evacuation step of evacuating the reactive material not having been used for the formation of the metallic ruthenium thin-film, in order to obtain a high-quality metallic ruthenium thin-film containing a small amount of residual carbon. Specifically, the method of the present invention preferably includes, after the thin-film formation step of forming a metallic ruthenium thin-film on the surface of the substrate by causing the precursor thin-film obtained in the precursor thin-film formation step to react with a reactive gas obtained by vaporizing the reactive material, a second evacuation step of evacuating the reactive material and a by-product gas. More specifically, the second evacuation step may be a step of evacuating, after the metallic ruthenium thin-film is formed in the thin-film formation step, the reactive gas not having been reacted with the surface of the precursor thin-film, and a by-product gas generated by causing the precursor thin-film to react with the reactive gas, from the film formation chamber. In the second evacuation step, it is ideal that the reactive gas and the by-product gas be completely evacuated from the film formation chamber, but it is not always required that the reactive gas and the by-product gas be completely evacuated. An evacuation method and the degree of decompression in the case of adopting decompression may be the same as in the above-mentioned first evacuation step.

The thin-film formation step in the method of producing a thin-film of the present invention is performed at least once, but may be performed twice or more until the metallic ruthenium thin-film achieves a desired thickness. That is, the thin-film may be formed by performing the thin-film formation step twice or more to laminate two or more metallic ruthenium thin-films. For example, the method of producing a thin-film may be performed as follows: a series of operations including the precursor thin-film formation step, the first evacuation step, the thin-film formation step, and the second evacuation step is defined as one cycle, and the number of cycles is adjusted so that the thickness of the metallic ruthenium thin-film may be adjusted.

As specific examples of an ALD apparatus to be used in the method of producing a thin-film of the present invention, there are given: an apparatus as illustrated in FIG. 1 capable of heating and/or decompressing the thin-film forming raw material in a raw material container to vaporizing the raw material, to thereby obtain a raw material gas, and supplying the raw material gas to a film formation chamber together with a carrier gas as required, and an apparatus as illustrated in FIG. 2 capable of transporting the thin-film forming raw material to a vaporization chamber under a state of a liquid or a solution, heating and/or decompressing the thin-film forming raw material in the vaporization chamber to vaporize the raw material, to thereby obtain a raw material gas, and supplying the raw material gas to the film formation chamber. The ALD apparatus is not limited to single-substrate type apparatus as illustrated in FIG. 1 and FIG. 2 each including the film formation chamber, and an apparatus capable of simultaneously processing a large number of substrates through use of a batch furnace may also be used.

In addition, in the method of producing a thin-film of the present invention, energy, such as plasma, light, or a voltage, may be applied in the film formation chamber as illustrated in each of FIG. 3 and FIG. 4, or a catalyst may be used therein. The timing at which the energy is applied and the timing at which the catalyst is used are not particularly limited. The energy may be applied or the catalyst may be used, for example, at the time of the introduction of the raw material gas into the film formation chamber or at the time of the heating in forming the precursor thin-film in the precursor thin-film formation step, at the time of the introduction of the reactive gas into the film formation chamber or at the time of causing the precursor thin-film to react with the reactive gas in the thin-film formation step, at the time of the evacuation of the raw material gas, the reactive gas, or the by-product gas from the film formation chamber in the first evacuation step or the second evacuation step, or between the above-mentioned respective steps.

In addition, in the method of producing a thin-film of the present invention, after the formation of the metallic ruthenium thin-film, annealing treatment may be performed under an inert atmosphere, an oxidizing atmosphere, or a reducing atmosphere in order to obtain a metallic ruthenium thin-film having more satisfactory electrical characteristics. When step embedding is required, a reflow step may be provided. A temperature in this case is preferably from 200° C. to 1,000° C., more preferably from 250° C. to 500° C. from the viewpoint that damage to the metallic ruthenium thin-film or the substrate caused by heat is suppressed.

The thin-film to be produced by the method of producing a thin-film of the present invention may be formed as a desired kind of thin-film, which covers a substrate formed of, for example, a metal, an oxide ceramic, a nitride ceramic, or glass, by appropriately selecting the other precursor, the reactive material, and the production conditions. The thin-film of the present invention is excellent in electrical characteristics and optical characteristics, and hence can be widely used in the production of, for example, electrode materials of memory devices typified by DRAM devices, wiring materials of semiconductor devices, diamagnetic films used for recording layers of hard disks, and catalyst materials for polymer electrolyte fuel cells.

Others

This disclosure provides the following aspects.

A reactive material, including a compound represented by the following general formula (1) or (2):

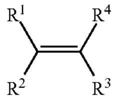

(1)

in the formula (1), $R^1$, $R^2$, $R^3$, and $R^4$ each independently represent a hydrogen atom, a hydrocarbon group having 1 to 4 carbon atoms, or an electron-withdrawing group, and the electron-withdrawing group is selected from the group consisting of: a fluorine atom; a chlorine atom; a bromine atom; an iodine atom; a trifluoromethyl group; a trichloromethyl group; a tribromomethyl group; a triiodomethyl group; a cyano group; an aldehyde group; an acetyl group; a carboxy group; a carboxymethyl group; a sulfo group; and a sulfomethyl group, provided that at least one of $R^1$, $R^2$, $R^3$, or $R^4$ represents the electron-withdrawing group; and

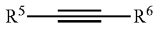

(2)

in the formula (2), $R^5$ and $R^6$ each independently represent a hydrogen atom, a hydrocarbon group having 1 to 4 carbon atoms, or an electron-withdrawing group, and the electron-withdrawing group is selected from the group consisting of: a fluorine atom; a chlorine atom; a bromine atom; an iodine atom; a trifluoromethyl group; a trichloromethyl group; a tribromomethyl group; a triiodomethyl group; a cyano group; an aldehyde group; an acetyl group; a carboxy group; a carboxymethyl group; a sulfo group; and a sulfomethyl group, provided that at least one of $R^5$ or $R^6$ represents the electron-withdrawing group.

[2] The reactive material according to Item [1], wherein the reactive material is used for reducing an organometallic compound to a metal.

[3] A method of producing a thin-film, including forming a metallic ruthenium thin-film through use of the reactive material of Item [1] or [2] by an atomic layer deposition method.

[4] The method of producing a thin-film according to Item [3], wherein the method includes the steps of: forming a precursor thin-film through use of a thin-film forming raw material containing an organoruthenium compound; and forming a metallic ruthenium thin-film by causing the precursor thin-film to react with the reactive material.

[5] The method of producing a thin-film according to Item [4], wherein the organoruthenium compound is selected from the group consisting of: an organoruthenium compound represented by the following general formula (3); an organoruthenium compound represented by the following general formula (4); and an organoruthenium compound represented by the following general formula (5):

$$Ru(L^1)_3 \quad (3)$$

$$Ru(L^1)_n(X)_{2-n}(L^2)_m \quad (4)$$

$$Ru(L^3)_y(L^4)_z(L^2)_m \quad (5)$$

in the formulae (3), (4), and (5), $L^1$ represents a covalent bonding ligand selected from the group consisting of: an aminoalkoxy group; an amidinate group; a β-diketonate group; a β-ketoiminate group; a β-diketiminate group; a group having a structure of a 2,4-pentadienyl group; and a group having a structure of a cyclopentadienyl group, X represents a halogen atom, "n" represents an integer of from 0 to 2, $L^2$ represents an electron-donating ligand selected from the group consisting of: a carbonyl group; a cyano group; a trialkylphosphine compound; and an isocyanide compound, "m" represents an integer of from 0 to 3, $L^3$ represents an electron-donating ligand selected from the group consisting of: a chain diene compound; a cyclic diene compound; a chain polyene compound; and a cyclic polyene compound, "y" represents 1 or 2, $L^4$ represents an electron-donating ligand formed of an arene compound, and "z" represents 0 or 1.

[6] The method of producing a thin-film according to Item [4] or [5], wherein the step of forming a precursor thin-film includes depositing the vaporized thin-film forming raw material on a surface of a substrate heated to a temperature of from 100° C. to 450° C.

[7] The method of producing a thin-film according to Item [6], wherein the method further includes, after the step of forming a precursor thin-film, a step of evacuating the undeposited thin-film forming raw material from a reaction system.

[8] The method of producing a thin-film according to Item [7], wherein the method further includes, after the step of forming a metallic ruthenium thin-film, a step of evacuating the unreacted reactive material from the reaction system, and wherein the method includes repeatedly performing the step of forming a precursor thin-film, the step of evacuating the undeposited thin-film forming raw material from the reaction system, the step of forming a metallic ruthenium thin-film, and the step of evacuating the unreacted reactive material from the reaction system.

EXAMPLES

The present invention is described in more detail below by way of Examples. However, the present invention is not limited by Examples and the like below.

Example 1

A thin-film was produced on a silicon wafer serving as a substrate by using Organoruthenium Compound No. 303 as a thin-film forming raw material with the ALD apparatus illustrated in FIG. 1 under the following conditions and through the following steps. When the composition of the thin-film was analyzed by X-ray photoelectron spectroscopy, it was recognized that the thin-film was a thin-film of metallic ruthenium, and the amount of residual carbon in the thin-film was less than 0.1 atm %, which was a detection limit. In addition, when the film thickness of the thin-film was measured by an X-ray reflectivity method, the thin-film formed on the substrate was a flat and smooth film having a film thickness of 1.6 nm, and a film thickness of 0.008 nm was obtained per cycle.

Conditions

Production method: ALD method
Reaction temperature (substrate temperature): 220° C.
Reactive gas: gas obtained by vaporizing Compound No. 43

Steps

A series of steps including the following (1) to (4) was defined as one cycle, and this cycle was repeated 200 times.

(1) A raw material gas obtained by vaporizing the thin-film forming raw material under the conditions of a raw material container temperature of 95° C. and a raw material container internal pressure of 26.67 Pa is introduced into a film formation chamber for 20 seconds, and the raw material gas is deposited on the surface of the substrate set in the film formation chamber.

(2) A raw material gas not having been deposited is evacuated from the inside of the system through argon purging for 10 seconds.

(3) A reactive gas is introduced into the film formation chamber, and the precursor thin-film is caused to react with the reactive gas at a system pressure of 100 Pa for 1 second.

(4) An unreacted reactive gas and a by-product gas are evacuated from the inside of the system through argon purging for 10 seconds.

Example 2

A thin-film was produced by the same procedure as in Example 1 except that the reactive gas was changed to a gas obtained by vaporizing Compound No. 135. When the composition of the thin-film was analyzed by X-ray photoelectron spectroscopy, it was recognized that the thin-film was a thin-film of metallic ruthenium, and the amount of residual carbon in the thin-film was less than 0.1 atm %, which was a detection limit. In addition, when the film thickness of the thin-film was measured by an X-ray reflectivity method, the thin-film formed on the substrate was a flat and smooth film having a film thickness of 1.5 nm, and a film thickness of 0.0075 nm was obtained per cycle.

Comparative Example 1

A thin-film was produced by the same procedure as in Example 1 except that the reactive gas was changed to oxygen. When the composition of the thin-film was analyzed by X-ray photoelectron spectroscopy, it was recognized that the thin-film was a thin-film of a mixture of metallic ruthenium and ruthenium oxide, and the amount of residual carbon in the thin-film was less than 0.1 atm %, which was a detection limit. In addition, when the film thickness of the thin-film was measured by an X-ray reflectivity method, the thin-film formed on the substrate was a flat and smooth film having a film thickness of 1.8 nm, and a film thickness of 0.009 nm was obtained per cycle.

Comparative Example 2

A thin-film was produced by the same procedure as in Example 1 except that the reactive gas was changed to hydrogen, and the reaction temperature (substrate temperature) was changed to 300° C. When the composition of the thin-film was analyzed by X-ray photoelectron spectroscopy, it was recognized that the thin-film was a thin-film of metallic ruthenium, and the amount of residual carbon in the thin-film was 4.5 atm %. In addition, when the film thickness of the thin-film was measured by an X-ray reflectivity method, the thin-film formed on the substrate was a flat and smooth film having a film thickness of 1.5 nm, and a film thickness of 0.0075 nm was obtained per cycle.

Example 3

A thin-film was produced on a silicon wafer serving as a substrate by using Organoruthenium Compound No. 306 as a thin-film forming raw material with the ALD apparatus illustrated in FIG. 1 under the following conditions and through the following steps. When the composition of the thin-film was analyzed by X-ray photoelectron spectroscopy, it was recognized that the thin-film was a thin-film of metallic ruthenium, and the amount of residual carbon in the thin-film was less than 0.1 atm %, which was a detection limit. In addition, when the film thickness of the thin-film was measured by an X-ray reflectivity method, the thin-film formed on the substrate was a flat and smooth film having a film thickness of 1.8 nm, and a film thickness of 0.009 nm was obtained per cycle.

Conditions

Production method: ALD method

Reaction temperature (substrate temperature): 230° C.

Reactive gas: gas obtained by vaporizing Compound No. 43

Steps

A series of steps including the following (1) to (4) was defined as one cycle, and this cycle was repeated 200 times.

(1) A raw material gas obtained by vaporizing the thin-film forming raw material under the conditions of a raw material container temperature of 120° C. and a raw material container internal pressure of 26.67 Pa is introduced into a film formation chamber having a system pressure of 26.67 Pa for 20 seconds, and the raw material gas is deposited on the surface of the substrate set in the film formation chamber.

(2) A raw material gas not having been deposited is evacuated from the inside of the system through argon purging for 10 seconds.

(3) A reactive gas is introduced into the film formation chamber, and the precursor thin-film is caused to react with the reactive gas at a system pressure of 100 Pa for 1 second.

(4) An unreacted reactive gas and a by-product gas are evacuated from the inside of the system through argon purging for 10 seconds.

Example 4

A thin-film was produced by the same procedure as in Example 3 except that the reactive gas was changed to a gas obtained by vaporizing Compound No. 135. When the composition of the thin-film was analyzed by X-ray photoelectron spectroscopy, it was recognized that the thin-film was a thin-film of metallic ruthenium, and the amount of residual carbon in the thin-film was less than 0.1 atm %, which was a detection limit. In addition, when the film thickness of the thin-film was measured by an X-ray reflectivity method, the thin-film formed on the substrate was a flat and smooth film having a film thickness of 1.6 nm, and a film thickness of 0.008 nm was obtained per cycle.

Comparative Example 3

A thin-film was produced by the same procedure as in Example 3 except that the reactive gas was changed to oxygen. When the composition of the thin-film was analyzed by X-ray photoelectron spectroscopy, it was recognized that the thin-film was a thin-film of a mixture of metallic ruthenium and ruthenium oxide, and the amount of residual carbon in the thin-film was less than 0.1 atm %, which was a detection limit. In addition, when the film thickness of the thin-film was measured by an X-ray reflectivity method, the thin-film formed on the substrate was a flat and smooth film having a film thickness of 1.9 nm, and a film thickness of 0.0095 nm was obtained per cycle.

Comparative Example 4

A thin-film was produced by the same procedure as in Example 3 except that the reactive gas was changed to hydrogen, and the reaction temperature (substrate temperature) was changed to 320° C. When the composition of the thin-film was analyzed by X-ray photoelectron spectroscopy, it was recognized that the thin-film was a thin-film of metallic ruthenium, and the amount of residual carbon in the thin-film was 6.5 atm %. In addition, when the film thickness of the thin-film was measured by an X-ray reflectivity method, the thin-film formed on the substrate was a flat and smooth film having a film thickness of 1.3 nm, and a film thickness of 0.0065 nm was obtained per cycle.

TABLE 1

| | Organo-Ru compound | Reactive gas | Component of thin-film | Amount of residual carbon |
|---|---|---|---|---|
| Example 1 | No. 303 | Gas obtained by vaporizing Compound No. 43 | Metallic ruthenium | Less than 0.1 atm % |
| Example 2 | No. 303 | Gas obtained by vaporizing Compound No. 135 | Metallic ruthenium | Less than 0.1 atm % |
| Example 3 | No. 306 | Gas obtained by vaporizing Compound No. 43 | Metallic ruthenium | Less than 0.1 atm % |
| Example 4 | No. 306 | Gas obtained by vaporizing Compound No. 135 | Metallic ruthenium | Less than 0.1 atm % |
| Comparative Example 1 | No. 303 | Oxygen | Mixture of metallic ruthenium and ruthenium oxide | Less than 0.1 atm % |
| Comparative Example 2 | No. 303 | Hydrogen | Metallic ruthenium | 4.5 atm % |

TABLE 1-continued

| | Organo-Ru compound | Reactive gas | Component of thin-film | Amount of residual carbon |
|---|---|---|---|---|
| Comparative Example 3 | No. 306 | Oxygen | Mixture of metallic ruthenium and ruthenium oxide | Less than 0.1 atm % |
| Comparative Example 4 | No. 306 | Hydrogen | Metallic ruthenium | 6.5 atm % |

It was recognized from the results that, in the method of producing a thin-film of the present invention, a high-quality metallic ruthenium thin-film containing a small amount of ruthenium oxide and a small amount of residual carbon was able to be produced even at low reaction temperature by using the reactive material containing a specific compound in an atomic layer deposition method. In addition, in the method of producing a thin-film of the present invention, a film thickness obtained per cycle was remarkably large, and hence it was suggested that high productivity was able to be achieved.

The invention claimed is:

1. A reactive material, comprising a compound represented by the following general formula (1) or (2):

(1)

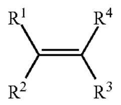

in the formula (1), $R^1$, $R^2$, $R^3$, and $R^4$ each independently represent a hydrogen atom, a hydrocarbon group having 1 to 4 carbon atoms, or an electron-withdrawing group, provided that at least one of $R^1$, $R^2$, $R^3$, or $R^4$ represents the electron-withdrawing group and the electron-withdrawing group is selected from the group consisting of: a fluorine atom; a chlorine atom; a bromine atom; an iodine atom; a trifluoromethyl group; a trichloromethyl group; a tribromomethyl group; a triiodomethyl group; a cyano group; an aldehyde group; an acetyl group; a carboxy group; a carboxymethyl group; a sulfo group; and a sulfomethyl group; and (2)

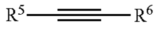

in the formula (2), $R^5$ and $R^6$ each independently represent a hydrogen atom, a hydrocarbon group having 1 to 4 carbon atoms, or an electron-withdrawing group, provided that at least one of $R^5$ or $R^6$ represents the electron-withdrawing group and the electron-withdrawing group is selected from the group consisting of: a fluorine atom; a chlorine atom; a bromine atom; an iodine atom; a trifluoromethyl group; a trichloromethyl group; a tribromomethyl group; a triiodomethyl group; a cyano group; an aldehyde group; an acetyl group; a carboxy group; a carboxymethyl group; a sulfo group; and a sulfomethyl group.

2. The reactive material according to claim 1, wherein the reactive material is used for reducing an organometallic compound to a metal.

3. A method of producing a thin-film, comprising forming a metallic ruthenium thin-film through use of the reactive material of claim 1 by an atomic layer deposition method.

4. The method of producing the thin-film according to claim 3, wherein the method comprises:

forming a precursor thin-film through use of a thin-film forming raw material containing an organoruthenium compound; and forming a metallic ruthenium thin-film by causing the precursor thin-film to react with the reactive material.

5. The method of producing the thin-film according to claim 4, wherein the organoruthenium compound is selected from the group consisting of: an organoruthenium compound represented by the following general formula (3); an organoruthenium compound represented by the following general formula (4); and an organoruthenium compound represented by the following general formula (5):

$$Ru(L^1)_3 \quad (3)$$

$$Ru(L^1)_n(X)_{2-n}(L^2)_m \quad (4)$$

$$Ru(L^3)_y(L^4)_z(L^2)_m \quad (5)$$

in the formulae (3), (4), and (5), $L^1$ represents a covalent bonding ligand selected from the group consisting of: an aminoalkoxy group; an amidinate group; a β-diketonate group; a β-ketoiminate group; a β-diketiminate group; a group having a structure of a 2,4-pentadienyl group; and a group having a structure of a cyclopentadienyl group, X represents a halogen atom, "n" represents an integer of from 0 to 2, $L^2$ represents an electron-donating ligand selected from the group consisting of: a carbonyl group; a cyano group; a trialkylphosphine compound; and an isocyanide compound, "m" represents an integer of from 0 to 3, $L^3$ represents an electron-donating ligand selected from the group consisting of: a chain diene compound; a cyclic diene compound; a chain polyene compound; and a cyclic polyene compound, "y" represents 1 or 2, $L^4$ represents an electron-donating ligand formed of an arene compound, and "z" represents 0 or 1.

6. The method of producing the thin-film according to claim 4, wherein the forming of the precursor thin-film comprises depositing the vaporized thin-film forming raw material on a surface of a substrate heated to a temperature of from 100° C. to 450° C.

7. The method of producing the thin-film according to claim 6, wherein the method further comprises, after the forming of the precursor thin-film, evacuating the undeposited thin-film forming raw material from a reaction system.

8. The method of producing the thin-film according to claim 7, wherein the method further comprises, after the forming of the metallic ruthenium thin-film, evacuating the unreacted reactive material from the reaction system, and wherein the method comprises repeatedly performing the forming of the precursor thin-film, the evacuating of the undeposited thin-film forming raw material from the reaction system, the forming of the metallic ruthenium thin-film, and the evacuating of the unreacted reactive material from the reaction system.

9. A reactive material, comprising:

a compound represented by the following general formula (1):

(1)

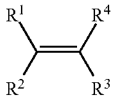

in which $R^1$, $R^2$, $R^3$, and $R^4$ each independently represent:

a hydrogen atom, a hydrocarbon group having 1 to 4 carbon atoms, or an electron-withdrawing group, with the proviso that at least two of $R^1$, $R^2$, $R^3$, or $R^4$ represent the electron-withdrawing group;

wherein the electron-withdrawing group is selected from the group consisting of:

a fluorine atom,
a chlorine atom,
a bromine atom,
an iodine atom,
a trifluoromethyl group,
a trichloromethyl group,
a tribromomethyl group,
a triiodomethyl group,
a cyano group,
an aldehyde group,
an acetyl group,
a carboxy group,
a carboxymethyl group,
a sulfo group, and
a sulfomethyl group.

10. The reactive material according to claim 9, wherein $R^1$ is the cyano group,
$R^2$ is the cyano group,
$R^3$ is the cyano group, and
$R^4$ is the cyano group.

11. A reactive material, comprising:

a compound represented by the following general formula (2):

(2)

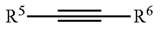

in which $R^5$ and $R^6$ each independently represent an electron-withdrawing group; wherein the electron-withdrawing group is selected from the group consisting of:

a fluorine atom,
a chlorine atom,
a bromine atom,
an iodine atom,
a trifluoromethyl group,
a trichloromethyl group,
a tribromomethyl group,
a triiodomethyl group,
a cyano group,
an aldehyde group,
an acetyl group,
a carboxy group
a carboxymethyl group,
a sulfo group,
and a sulfomethyl group.

* * * * *